(12) United States Patent
Yoshikawa

(10) Patent No.: US 7,113,053 B2
(45) Date of Patent: Sep. 26, 2006

(54) PULSE-WIDTH MODULATION SIGNAL GENERATING DEVICE AND METHOD FOR GENERATING PULSE-WIDTH MODULATION SIGNALS

(75) Inventor: Osamu Yoshikawa, Tokyo (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 11/215,353

(22) Filed: Aug. 29, 2005

(65) Prior Publication Data

US 2006/0125539 A1    Jun. 15, 2006

(30) Foreign Application Priority Data

Dec. 15, 2004  (JP) .............................. 2004-362818

(51) Int. Cl.
*H03K 7/08*  (2006.01)
(52) U.S. Cl. ...................................... 332/110; 327/175
(58) Field of Classification Search ................ 332/110; 327/172, 175
See application file for complete search history.

(56) References Cited

U.S. PATENT DOCUMENTS 6,023,199 A * 2/2000 Cheung ...................... 332/109

OTHER PUBLICATIONS

Patent Abstracts of Japan for 11-345033 published on Dec. 14, 1999.

* cited by examiner

*Primary Examiner*—Shawn Riley
(74) *Attorney, Agent, or Firm*—Darby & Darby

(57) ABSTRACT

Pulse-width modulation signal generating device and method for the same that can generate multiple pulse-width modulation signals with different overall lengths wherein only a small amount of data is stored in storage means and duty cycles are varied between individual unit pulse signals. Multiple settings are stored in storing means for three types of variables: initial duty cycle; duty change range; and number of unit pulse signals that form a single phase. Out of these, a selected initial duty cycle, a selected duty change range, and a selected number of unit pulse signals that form a single phase are retrieved. These selected values are used to represent the duty cycles for all unit pulse signals forming one phase. The unit pulse signals for which duty cycles have been determined are output to generate a pulse-width modulation signal.

12 Claims, 10 Drawing Sheets

| DATA | PULSE PERIOD | REPEAT COUNT | GENERATED PULSE DUTY SETTING | | NUMBER OF UNITS IN PHASE |
|---|---|---|---|---|---|
| | | | INITIAL DUTY CYCLE | DUTY CHANGE RATE | |
| 0 h | — | CONTINUOUS | 0% | 0.0% | 1 |
| 1 h | 48 μs | 1 | 4% | 0.5% | 2 |
| 2 h | 56 μs | 2 | 8% | 1.0% | 3 |
| 3 h | 64 μs | 3 | 12% | 1.5% | 4 |
| 4 h | 80 μs | 4 | 16% | 2.0% | 5 |
| 5 h | 96 μs | 5 | 20% | 2.5% | 7 |
| 6 h | 112 μs | 6 | 24% | 3.0% | 9 |
| 7 h | 128 μs | 7 | 28% | 3.5% | 12 |
| 8 h | 144 μs | 8 | 32% | −4.0% | 16 |
| 9 h | 192 μs | 9 | 36% | −3.5% | 21 |
| A h | 240 μs | 10 | 40% | −3.0% | 28 |
| B h | 288 μs | 11 | 44% | −2.5% | 37 |
| C h | 336 μs | 12 | 48% | −2.0% | 49 |
| D h | 384 μs | 13 | 52% | −1.5% | 65 |
| E h | 432 μs | 14 | 56% | −1.0% | 86 |
| F h | 480 μs | 15 | 60% | −0.5% | 114 |

FIGURE 6

| Byte | Function | Bit Series | | | | | | | |
|---|---|---|---|---|---|---|---|---|---|
| | | D7 | D6 | D5 | D4 | D3 | D2 | D1 | D0 |
| 1 | Initial Settings | Pulse Period | | | | Repeat Count | | | |
| 2 | Number of Units in Phase | Phase 2 Unit Count | | | | Phase 1 Unit Count | | | |
| 3 | | Phase 4 Unit Count | | | | Phase 3 Unit Count | | | |
| 4 | | Phase 6 Unit Count | | | | Phase 5 Unit Count | | | |
| 5 | | Phase 8 Unit Count | | | | Phase 7 Unit Count | | | |
| 6 | Waveform | Phase 2 Initial Duty Cycle | | | | Phase 1 Initial Duty Cycle | | | |
| 7 | | Phase 2 Duty Change Rate | | | | Phase 1 Duty Change Range | | | |
| 8 | | Phase 2 Port Polarity | | | | Phase 1 Port Polarity | | | |
| 9 | | Phase 4 Initial Duty Cycle | | | | Phase 3 Initial Duty Cycle | | | |
| 10 | | Phase 4 Duty Change Rate | | | | Phase 3 Duty Change Range | | | |
| 11 | | Phase 4 Port Polarity | | | | Phase 3 Port Polarity | | | |
| 12 | | Phase 6 Initial Duty Cycle | | | | Phase 5 Initial Duty Cycle | | | |
| 13 | | Phase 6 Duty Change Rate | | | | Phase 5 Duty Change Range | | | |
| 14 | | Phase 6 Port Polarity | | | | Phase 5 Port Polarity | | | |
| 15 | | Phase 8 Initial Duty Cycle | | | | Phase 7 Initial Duty Cycle | | | |
| 16 | | Phase 8 Duty Change Rate | | | | Phase 7 Duty Change Range | | | |
| 17 | | Phase 8 Port Polarity | | | | Phase 7 Port Polarity | | | |

FIGURE 7

| Phase | Unit Count | PWM Settings | | Port Settings | | | | SW Operations | | | | | |
|---|---|---|---|---|---|---|---|---|---|---|---|---|---|
| | | Initial | Change Rate | P0 | P1 | P2 | P3 | SW1 | SW2 | SW3 | SW4 | SW5 | SW6 |
| 1 | 9(21) | 8% | 3.5% | H | L | H | L | ON | PWM | OFF | OFF | Vdd | GND |
| 2 | 5(7) | 60% | -4.0% | H | L | H | L | ON | PWM | OFF | OFF | Vdd | GND |
| 3 | 5(7) | 0% | 1.0% | H | L | L | H | OFF | OFF | ON | PWM | Vdd | GND |
| 4 | 6(9) | 40% | 3.5% | H | L | L | H | OFF | OFF | ON | PWM | Vdd | GND |
| 5 | 9(21) | 8% | 3.5% | L | H | H | L | ON | PWM | OFF | OFF | GND | Vdd |
| 6 | 5(7) | 60% | -4.0% | L | H | H | L | ON | PWM | OFF | OFF | GND | Vdd |
| 7 | 5(7) | 0% | 1.0% | L | H | L | H | OFF | OFF | ON | PWM | GND | Vdd |
| 8 | 6(9) | 40% | 3.5% | L | H | L | H | OFF | OFF | ON | PWM | GND | Vdd |
| Stopped | - | - | - | L | L | L | L | OFF | OFF | OFF | OFF | GND | GND |

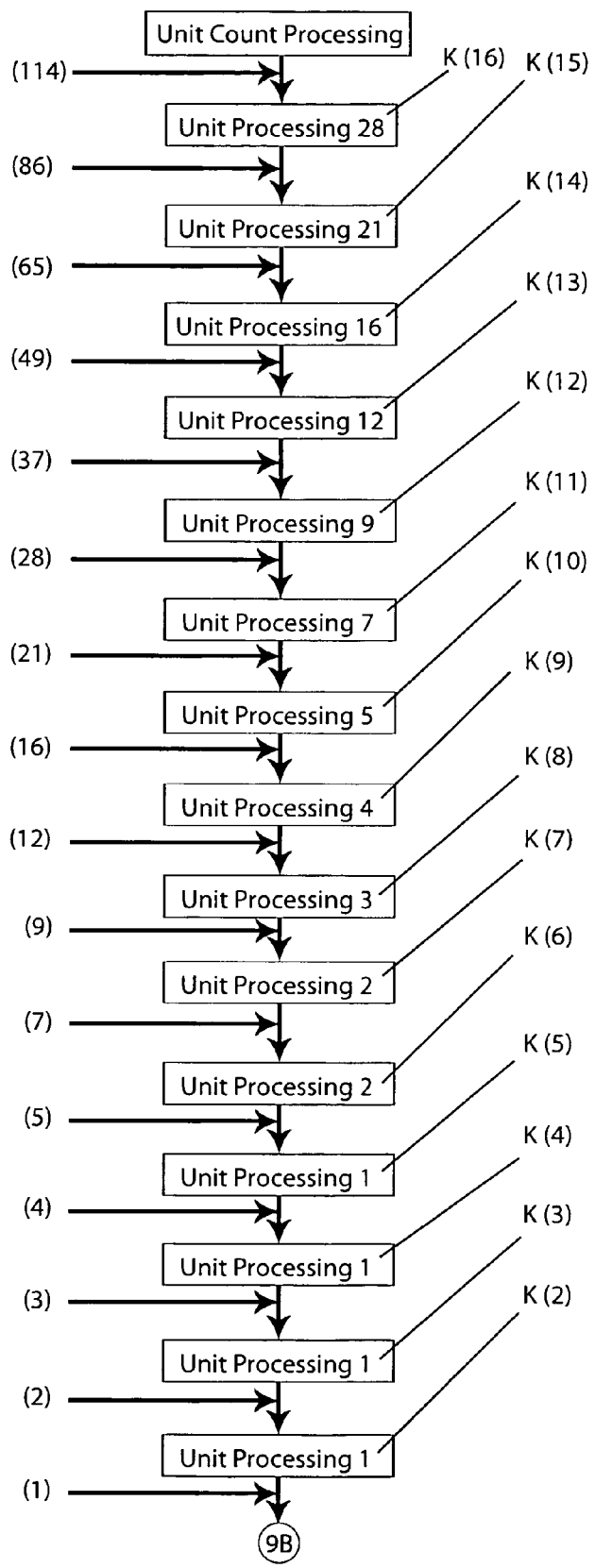

PULSE-WIDTH MODULATION SIGNAL GENERATING DEVICE AND METHOD FOR GENERATING PULSE-WIDTH MODULATION SIGNALS

INCORPORATION BY REFERENCE

The present application claims priority under 35 U.S.C. §119 to Japanese Patent Application No. 2004-362818 filed on Dec. 15, 2004 in the Japanese language, which is hereby incorporated by reference in its entirety.

FIELD OF INVENTION

The present invention relates to a device for generating pulse-width modulation signals used as control signals to control the operations of a load by changing pulse widths, and a method for generating the same, and more particularly to a pulse width modulating device that generates varied pulse width modulating signals for each single unit pulse period.

BACKGROUND OF THE INVENTION

Operations of a load such as a motor are controlled by connecting a switching element in series with the load. The current flowing to the load is controlled by turning the switching element on and off using a pulse-width modulation signal (hereinafter referred to as a PWM signal) in which the duty cycle varies.

FIG. 12 is a block diagram showing a conventional pulse-width modulation signal device 100 that generates a PWM signal used as this type of control signal and outputs this signal to a load (see Japanese laid-open patent publication number 11-345033 (Page 2, FIG. 8)). The operations of a load 101, e.g., a motor or a solenoid, is controlled by a PWM signal output from a microcontroller 103 by way of an output circuit 102. The microcontroller 103 receives an input signal from an input device 104. The microcontroller 103 includes: a CPU 103a that provides to the output circuit 102 a PWM signal, as depicted in FIG. 13, in which the duty cycle is varied according to the input signal, and a timer/counter 103b that generates interrupt requests for the CPU 103a.

The CPU 103a sets the PWM signal level to HIGH during a fixed period (Tc) shown in FIG. 13. The level of the input signal received from the input device is converted to a PWM signal pulse width. When the converted value (T1) exceeds a software counter value (S), the level of the PWM signal is set to LOW.

The software counter value (S) is incremented at each interrupt period (Tc) set up by the timer/counter 103b. Each time the CPU 103a receives an interrupt, the counter (S), which increases as time goes on, and the converted value (T1) are compared. Thus, a PWM signal with pulse widths based on input signal levels is generated with a resolution defined by the interrupt period (Tc). In other words, for the PWM signal depicted in FIG. 13, at each fixed period Tc unit pulse signal, the pulse width T1 is determined by the input signal level, and the duty cycle, which is the ratio of the pulse width T1 and the fixed period Tc is varied by the microcontroller 103 between 0% and 100% for each unit pulse signal.

In this conventional pulse-width modulating signal generating device 100, the operation of the load 101 is monitored. If feedback control of the load 101 is to be performed using a PWM signal based on the operating condition, the input device 104 is connected to the load 101, with the input signal level being set by the current flowing to the load 101 to generate the PWM signal. However, there is a delay of at least the fixed period Tc in the duty cycle of the PWM signal reflecting the current flowing to the load 101. The delay reflects the time between when the current flowing to the load 101 is detected and when the unit pulse signal with a duty cycle based on this current is generated. This results in a limit to responsiveness and prevents the accurate control of the load 101.

In another proposed method, multiple types of operation patterns for the load 101 are set up, and sequence control is performed using a PWM signal so that one of these operation patterns is implemented depending on the operation condition of the load 101. Alternatively, no feedback control is performed at all and all operations of the load 101 are controlled via sequence control using a PWM signal. In these control methods, the input device 104 must be equipped with storing means storing signal modulation data for generating new input signals corresponding to these sequences.

However, if the fixed period Tc of the unit pulse signal is set to a short interval (e.g., on the order of a few dozen microseconds), a large amount of modulation data must be stored in storing means in order to generate PWM signals for a series of control periods for the load 101 where the modulation data changes the duty cycle for each unit pulse signal. In particular, generating a PWM signal in which the duty cycle varies over a broad range from 0% to 100% means that the duty cycle must be represented by a large number of bits, thus further increasing the volume of the modulation data to be stored.

Furthermore, when sequence control is to be used on the load 101 for different operation patterns, signal modulation data for these control operations must be generated and stored in storing means for each operation pattern. Thus, even a change in the control period for the operation pattern required the storing of separate modulation data.

Based on the above factors, when modulation data stored in storing means is used to generate PWM signals to control a load, the storage capacity of storing means limited the type of load controls and number of control patterns that could be implemented. This prevented the load from being controlled freely.

DEFINITION OF TERMS

As used herein a "unit pulse signal" means a single pulse period (i.e., signal goes from a first binary state, to a second state and then returns to the first state).

As used herein a "unit signal" means at least two adjacent pulse periods.

SUMMARY OF THE INVENTION

In one aspect of the invention, a pulse width modulation signal generating device generates a pulse width modulation signal formed continuously from a plurality of unit pulse signals while changing a duty cycle by a predetermined duty change rate, where a period of a unit pulse signal formed from a first level and a second level continuous with the first level is a fixed period Tc. The pulse width modulation signal generating device includes: storage means storing a plurality of sets of data of an initial duty cycle, a duty change rate, and a count of unit pulse signals forming a phase for defining individual phases of a pulse width modulation signal; data reading means for, when generating the pulse width modulation signal, reading out of the plurality of sets of data stored in storage means, a selected initial duty cycle, a selected duty change rate, and a selected unit pulse signal count for a phase to be generated; a period timer repeatedly measuring the fixed period Tc; arithmetic means performing calculations wherein, in a first unit pulse signal the selected initial duty cycle is multiplied with the fixed period Tc, and in a second and subsequent unit pulse signals, the selected duty change rate is added to or subtracted from a duty cycle of an immediately preceding unit pulse signal with a duty cycle obtained by the addition or subtraction being multiplied with the fixed period Tc, resulting in a first level generating interval T1 for each unit pulse signal; a PWM timer initiating a time measurement of the first level generating interval T1 each time the period timer initiates a time measurement for the fixed period Tc; and signal generating means wherein, when the period timer initiates a time measurement of the fixed period Tc, a signal level of the pulse width modulation signal is set to a first level and when the PWM timer measures the first level generating interval T1, the first level is changed to the second level, and the second level is maintained until the period timer measures the fixed period Tc.

Signal generating means continuously generates a number of unit pulse signals determined by the selected unit pulse signal count and generates a pulse width modulation signal for 1 phase.

The first level generating interval T1 for the first unit pulse signal is calculated by multiplying the selected initial duty cycle with the fixed period Tc. The first level generating interval T1 for the second and subsequent unit pulse signals is calculated by adding or subtracting the selected duty change rate to or from the duty cycle of the immediately preceding unit pulse signal and then multiplying the fixed period Tc with the result. Signal generating means sets up the first level when the period timer begins measuring the fixed period Tc. When the PWM timer measures the first level generating interval T1, the signal level of the pulse width modulation signal is changed from the first level to the second level. As a result, for each period Tc, a unit pulse signal is generated with a duty cycle determined by the selected initial duty cycle and the selected duty cycle change rate, and these unit pulse signals are generated continuously.

The length of one phase of the pulse width modulation signal is obtained by multiplying the selected unit pulse signal count forming one phase with the fixed period Tc.

Since the duty cycle of the unit pulse signals increase or decrease according to a fixed selected duty change rate, the maximum duty cycle and the minimum duty cycle contained in the pulse width modulation signal is determined by the selected unit pulse signal count and the selected duty change rate that is retrieved.

In another aspect of the invention, a data reading device, for each of the plurality of phases, reads a selected initial duty cycle, a selected duty change rate, and a selected unit pulse signal count selected for each phase. A signal generating device continuously generates pulse width modulation signals for each phase.

Pulse width modulation signals that cannot be generated from one type of selected initial duty cycle, selected duty change rate, and selected unit pulse signal count can be generated by continuously generating pulse width modulation signals from different phases.

In yet another aspect of the invention, N types of data (where N is a positive integer of at least 2) can be stored in storage means for the unit pulse signal count of a phase, the data being positive integers approximating an exponential function:

$$F(x)=a^x;$$

where x is a positive integer and a is a positive number of at least 1, so that when the N types of data are rearranged from a minimum value K(1) to a maximum value K(n), an n-th data K(n) (where n is a positive integer of at least 2) and an (n−1)-th data K(n−1) have a difference d(n) that is represented in one of the data at an (n−1)-th position or below.

Since the multiple data entries stored in the storage device for the unit pulse signal count for one phase are integers approximating an exponential function, when these values are sorted, the smaller values are spaced closer together while the larger values are spaced wider apart while maintaining continuity.

When the multiple data entries stored in the storage unit for the unit pulse signal count for one phase are sorted from the minimum value K(1) to the maximum value K(N), a data K(n) that is a second or subsequent data can be expressed as the sum of the two smaller data entries (K(n−1)+d(n)). When, out of the multiple entries of stored data, a selected unit pulse signal count that is not the minimum value is retrieved and a pulse width modulation signal is to be generated for one phase, this can be done using an operation for generating another pulse width modulation signal that differs only in its selected unit pulse signal count.

In a still yet another aspect of the invention, a is 1.321279. Since the base a of the exponential function F(x) represented by:

$F(x)=a^x$ is 1.321279, 16 settings for the number of unit pulse signals that form a phase can be stored in storage means, in the form of positive integer entries from 1 to 114 that approximate the above equation.

In yet still another aspect of the invention, a method generates a pulse width modulation signal formed continuously from a plurality of unit pulse signals while changing a duty cycle by a predetermined duty change rate, where a period of a unit pulse signal formed from a first level and a second level continuous with the first level is a fixed period Tc. The pulse width modulation signal generating method includes: a first step for reading, for a phase to be generated, an initial duty cycle, a duty change rate, and a count of unit pulse signals forming phase from storage means storing a plurality of sets of data of an initial duty cycle, a duty change rate, and a count of unit pulse signals forming a phase for defining individual phases of a pulse width modulation signal; a second step for multiplying the selected initial duty cycle to the fixed period Tc to calculate a first level generating interval T1 of a first unit pulse signal; a third step for generating a unit pulse signal wherein the first level generating interval T1 after the fixed period Tc begins is set to a first level and a remaining interval in the fixed period Tc is set to a second level; and a fourth step for calculating first level generating intervals Ta for second and subsequent unit pulse signals by adding or subtracting the selected duty change rate to or from a duty cycle of an immediately preceding unit pulse and multiplying the duty cycle obtained by adding or subtracting to the fixed period Tc. A pulse width modulation signal for one phase is generated by repeatedly executing, by a number corresponding to the selected unit pulse signal count, a step for generating signals that, after executing the first step and the second step, executes the third step and then the fourth step.

The first level generating interval T1 for the first unit pulse signal is calculated by multiplying the selected initial duty cycle with the fixed period Tc. The first level generating intervals T1 for the second and subsequent unit pulse signals are calculated by adding or subtracting the selected duty change rate to or from the duty cycle of the immediately preceding unit pulse signal and then multiplying the fixed period Tc with the result. These calculations are performed by the second step and the fourth step, respectively.

In the third step, the first unit pulse signal is generated with the calculated first level generating interval T1 set to the first level and the remaining interval in the fixed period Tc set to the second level. Thus, a pulse width modulation signal for one phase can be generated by, after executing the first step and the second step, repeating the third step and the fourth step by the selected unit pulse signal count.

In the pulse width modulation signal generating method according to claim 6, N types of data (where N is a positive integer of at least 2) can be stored in storage means for the unit pulse signal count of a phase, the data being positive integers approximating an exponential function F(x)

$$F(x)=a^x;$$

where x is a positive integer and a is a positive number of at least 1, so that when the N types of data are rearranged from a minimum value K(1) to a maximum value K(n), an n-th data K(n) (where n is a positive integer of at least 2) and an (n−1)-th data K(n−1) have a difference d(n) that is represented in one of the data at an (n−1)-th position or below.

When the multiple data entries stored in storage means for the unit pulse signal count for one phase are sorted from the minimum value K(1) to the maximum value K(N), a data K(n) that is a second or subsequent data can be expressed as the sum of the two smaller data entries (K(n−1)+d(n)). Thus, the signal generating step that executes the third step and then the fourth step repeatedly can make use of other repeating steps even if the selected unit pulse signal count that was retrieved is different.

A pulse width modulation signal generating method as described in claim 6 wherein, in an operation for repeatedly and continuously executing the signal generating step by a number corresponding to the selected unit pulse signal count:

K(n) subroutines, where n is from 2 to N, are arranged in order upstream in execution flow from a K(1) subroutine, where the K(1) subroutine executes the signal generating step K(1) times, and the K(n) subroutines are jump points for when the selected unit pulse signal count is K(n);

if d(n) is K(1), the jump point for the K(n) subroutine is the K(1) subroutine;

if d(n) is an integer other than the K(1), then for an n' where d(n) is K(n'), a K(n') subroutine, which serves as a jump point for when the selected unit pulse signal count is d(n), is used as a jump point for the K(n) subroutine; and at the K(n') subroutine jump point, a jump point subroutine is similarly determined where n' is n, and the operation is repeated until d(n) is K(1) and the K(1) subroutine is a jump point.

The K(n) subroutine, which is the jump point when the selected unit pulse signal count is K(n), executes the signal generating step K(1) times in the K(1) subroutine if d(n) is K(1). If d(n) is an integer other than K(1), an n' for which d(n) is K(n') is determined and a jump is made to the K(n') subroutine, which is the jump point for when the selected unit pulse signal count is d(n). Then, at the K(n') subroutine, a jump point is determined in a similar manner with n' as n. This is repeated until the jump point is the K(1) subroutine and the signal generating step is executed K(1) times.

As a result, at the K(n) subroutine, the jump destination is a subroutine that repeats the signal generation step d(n) times, where d(n) is K(n)−K(n−1), and then control proceeds to the K(n−1) subroutine downstream in the execution flow.

Similarly, the K(n−1) subroutine executes a subroutine that performs the signal generation step d(n−1) times, and then control proceeds to the subroutine downstream from it in the execution flow. This is repeated until the signal generation step is performed once at K(1), which is the furthest downstream in the execution flow, and this concludes the execution flow.

Thus, when the initial jump point is the K(n) subroutine, the entire execution flow executes the signal generation step $$K(1) + \sum_{i=2}^{n} d(i) \text{ times, i.e., } K(n) \text{ times.}$$

The pulse width modulation signal generating method according to claim 8 generates a pulse width modulation signal formed continuously from a plurality of unit pulse signals while changing a duty cycle by a predetermined duty change rate, where a period of a unit pulse signal formed from a first level and a second level continuous with the first level is a fixed period Tc. The pulse width modulation signal generating method includes: a first step for reading, for a phase to be generated, an initial duty cycle, a duty change rate, and a count of unit pulse signals forming phase from storage means storing a plurality of sets of data of an initial duty cycle, a duty change rate, and a count of unit pulse signals forming a phase for defining individual phases of a pulse width modulation signal; a second step for multiplying the selected initial duty cycle to the fixed period Tc to calculate a first level generating interval T1 of a first unit pulse signal; a third step for generating a unit pulse signal wherein the first level generating interval T1 after the fixed period Tc begins is set to a first level and a remaining interval in the fixed period Tc is set to a second level; and a fourth step for calculating first level generating intervals T1 for second and subsequent unit pulse signals by adding or subtracting the selected duty change rate to or from a duty cycle of an immediately preceding unit pulse and multiplying the duty cycle obtained by adding or subtracting to the fixed period Tc. A pulse width modulation signal for one phase is generating by repeatedly executing, by a number corresponding to the selected unit pulse signal count, a step for generating a unit signal that, after executing the first step and the second step, repeats twice an execution of the third step and then the fourth step.

The first level generating interval T1 for the first unit pulse signal is calculated by multiplying the selected initial duty cycle with the fixed period Tc. The first level generating intervals T1 for the second and subsequent unit pulse signals are calculated by adding or subtracting the selected duty change rate to or from the duty cycle of the immediately preceding unit pulse signal and then multiplying the fixed period Tc with the result. These calculations are performed by the second step and the fourth step, respectively.

In the third step, the first unit pulse signal is generated with the calculated first level generating interval T1 set to the first level and the remaining interval in the fixed period Tc set to the second level. Thus, a pulse width modulation signal for one phase can be generated by, after executing the first step and the second step, repeating the third step and the fourth step by the selected unit count.

In a further aspect of the invention, N types of data (where N is a positive integer of at least 2) can be stored in storage means for the unit count of a phase, the data being positive integers approximating an exponential function F(x) $F(x)=a^x$;

where x is a positive integer and a is a positive number of at least 1, so that when the N types of data are rearranged from a minimum value K(1) to a maximum value K(n), an n-th data K(n) (where n is a positive integer of at least 2) and an (n−1)-th data K(n−1) have a difference d(n) that is represented in one of the data at an (n−1)-th position or below.

When the multiple data entries stored in storage means for the unit count for one phase are sorted from the minimum value K(1) to the maximum value K(N), a data K(n) that is a second or subsequent data can be expressed as the sum of the two smaller data entries (K(n−1)+d(n)). Thus, the signal generating step that executes the third step and then the fourth step repeatedly can make use of other repeating steps even if the selected unit count that was retrieved is different.

In yet a further aspect of the invention, in an operation for repeatedly and continuously executing the signal generating step by a number corresponding to the selected unit count: K(n) subroutines, where n is from 2 to N, are arranged in order upstream in execution flow from a K(1) subroutine, where the K(1) subroutine executes the signal generating step K(1) times, and the K(n) subroutines are jump points for when the selected unit pulse signal count is K(n); if d(n) is K(1), the jump point for the K(n) subroutine is the K(1) subroutine; if d(n) is an integer other than the K(1), then for an n' where d(n) is K(n'), a K(n') subroutine, which serves as a jump point for when the selected unit pulse signal count is d(n), is used as a jump point for the K(n) subroutine; and at the K(n') subroutine jump point, a jump point subroutine is similarly determined where n' is n, and the operation is repeated until d(n) is K(1) and the K(1) subroutine is a jump point.

The K(n) subroutine, which is the jump point when the selected unit count is K(n), executes the signal generating step K(1) times in the K(1) subroutine if d(n) is K(1). If d(n) is an integer other than K(1), an n' for which d(n) is K(n') is determined and a jump is made to the K(n') subroutine, which is the jump point for when the selected unit count is d(n). Then, at the K(n') subroutine, a jump point is determined in a similar manner with n' as n. This is repeated until the jump point is the K(1) subroutine and the signal generating step is executed K(1) times.

As a result, at the K(n) subroutine, the jump destination is a subroutine that repeats the signal generation step d(n) times, where d(n) is K(n)−K(n−1), and then control proceeds to the K(n−1) subroutine downstream in the execution flow.

Similarly, the K(n−1) subroutine executes a subroutine that performs the signal generation step d(n−1) times, and then control proceeds to the subroutine downstream from it in the execution flow. This is repeated until the signal generation step is performed once at K(1), which is the furthest downstream in the execution flow, and this concludes the execution flow.

Thus, when the initial jump point is the K(n) subroutine, the entire execution flow executes the signal generation step $$K(1) + \sum_{I=2}^{n} d(i) \text{ times,}$$

i.e., K(n) times.

In certain aspects, the duty cycles of all the unit pulse signals in a single phase can be represented by three variables: the initial duty cycle; the duty change rate; and the number of unit pulse signals that form one phase. Different types of pulse width modulation signals can be selected and generated simply by storing data for these variables in storage means.

A selected initial duty cycle and a selected duty change rate and a selected unit pulse signal count can be stored in storage means according to the type of sequence control that is to be performed on a load. This data can be retrieved and a pulse control signal for one phase can be generated. Thus, with three types of data, sequence control for different types of objectives can be performed.

By selecting a desired selected unit pulse signal count from the unit pulse signal counts for one phase, it is possible to freely select the length of one phase of the pulse width modulation signal.

By combining selected initial duty cycles, selected unit pulse signal counts, and selected duty change rates, the maximum duty cycle and the minimum duty cycle contained in the pulse width modulation signal can be freely determined.

In addition, in another aspect of the invention, pulse width modulations are generated continuously with changes in at least one of the initial duty cycle, the duty change rate, and the number of unit pulse signals in a single phase.

Even if the sequence control to be performed on the load changes in a complex manner, one phase of a pulse width modulation signal that matches at least one portion of the control operation can be generated by retrieving a selected initial duty cycle, a selected duty change range, and a selected unit pulse signal count from storage means. Thus, complex sequence control for the entire sequence control operation can be performed by continuously generating pulse width control signals for multiple phases generated by the same method.

According to certain other aspects of the invention, a limited number of data entries can be used to represent the number of unit pulse signals in one phase, i.e., the length of one phase, in an efficient manner by using a finer resolution for lower counts and wider intervals for higher numbers so that the changes can be more clearly distinguished.

Also, the overall generation operation can be significantly simplified because, for a section of the operation for retrieving a selected unit pulse signal count and generating a pulse width modulation signal for one phase, another pulse width modulation signal generating operation that differs only in the selected unit pulse signal count can be used.

In addition, in yet another aspect, data entries with one to three places (digits) that have continuity with each other can be represented with 4 bits of data and stored in storage means.

According to still yet another aspect of the invention, a K(1) subroutine is formed that repeats a signal step K(1) times, where K(1) is the minimum value. K(n) subroutines, which are the jump points for when the selected unit pulse signal count is another value, are defined so that K(n) subroutines are defined so that they are arranged upstream from each other in the execution flow. As a result, no matter which of the N types of data entries are used for the selected unit pulse signal count, a single program can be used to repeat a signal generation step for the number of iterations corresponding to the selected unit pulse signal count.

According to still a further aspect of the invention, the duty cycles of all the pulses in a single phase can be represented with three variables: the initial duty cycle; the duty change rate; and the number of units forming one phase. As a result, different types of pulse width modulation signals can be selected and generated by using storage means to store data for these variables.

A selected initial duty cycle and a selected duty change rate and a selected unit count can be stored in storage means according to the type of sequence control that is to be performed on a load. This data can be retrieved and a pulse control signal for one phase can be generated. Thus, with three types of data, sequence control for different types of objectives can be performed.

Since a pair of adjacent unit pulse width modulation signals serve as a unit signal, the number of unit pulse signals that form one phase can be stored in storage means as unit counts, using fewer bits.

In addition, in still another aspect of the invention, a limited number of data entries can be used to represent the number of units in one phase in an efficient manner by using a finer resolution for lower counts and wider intervals for higher numbers so that the changes can be more clearly distinguished.

Also, the overall generation operation can be significantly simplified because, for a section of the operation for retrieving a selected unit count and generating a pulse width modulation signal for one phase, another pulse width modulation signal generating operation that differs only in the selected unit count can be used.

In addition, in yet a further aspect of the invention, a K(1) subroutine is formed that repeats a signal step K(1) times, where K(1) is the minimum value. K(n) subroutines, which are the jump points for when the selected unit count is another value, are defined so that K(n) subroutines are defined so that they are arranged upstream from each other in the execution flow. As a result, no matter which of the N types of data entries are used for the selected unit count, a single program can be used to repeat a signal generation step for the number of iterations corresponding to the selected unit count.

The above, and other aspects, features and advantages are combinable to form embodiments of the present invention. These embodiments will become apparent from the following description read in conjunction with the accompanying drawings, in which like reference numerals designate the same elements.

BRIEF DESCRIPTION OF THE DRAWINGS

FIG. 6 illustrates an embodiment of a data format stored in a ROM;

FIG. 7 illustrates an embodiment of signal modulation data;

FIGS. 9A and 9B illustrate a subroutine that performs unit count processing in the process of FIG. 8;

DETAILED DESCRIPTION OF THE ILLUSTRATED EMBODIMENTS

By way of overview and introduction, presented is a pulse width modulating signal generating device, and method for generating the same, that can generate multiple PWM signals with different overall lengths and duty cycles for each unit pulse signal while storing a small amount of data in a data storage device.

The pulse width modulating signal generating device, and method for generating the same, can generate a pulse width modulation signal modulated for each unit pulse signal even if the fixed period Tc is a very short interval. Further, the pulse width modulating signal generating device, and method for generating the same, can generate multiple PWM signals with significantly different overall lengths using a small amount of data.

Figure 1:
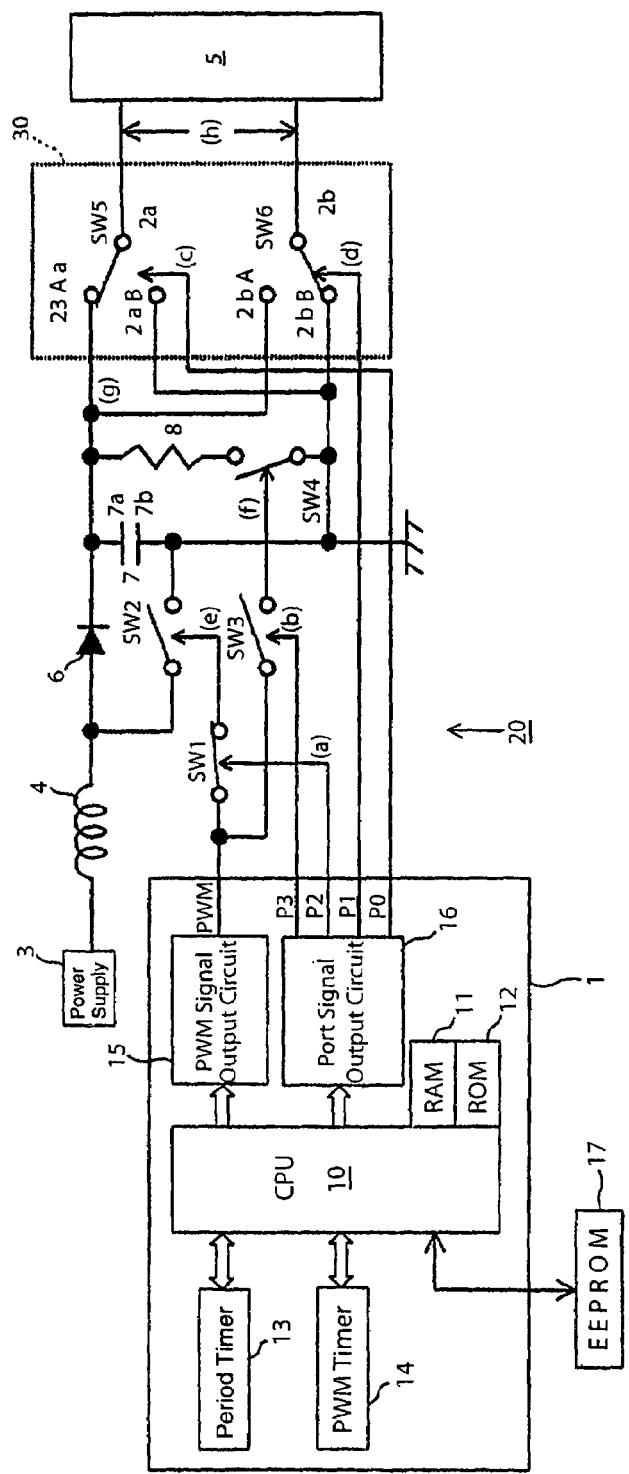
FIG. 1 is a schematic diagram showing a pulse width modulation signal generating device and a wave-shaping circuit according to an embodiment of the present invention.

A pulse width modulating signal generating device 1 and a method for generating pulse-width modulation signals according to an embodiment of the present invention will be described, with references to FIG. 1 through FIG. 12. FIG. 1 is a schematic diagram showing a controller 1, corresponding to a pulse width modulation signal generating device, and a wave-shaping circuit 20 controlled by the controller 1.

The controller 1 outputs a pulse-width modulation signal (hereinafter referred to as PWM signal) with varied duty cycles from a PWM terminal to SW2 and SW4 of the wave-shaping circuit 20. Changes in PWM signal levels are used to open and close SW2 and SW 4, and control current flow to their respective load. A coil 4 and a discharge resistor 8, are controlled by the duty cycle. As a result, a freely shaped output potential is formed between output terminals 2a, 2b of the wave-shaping circuit 20.

Figure 2A:
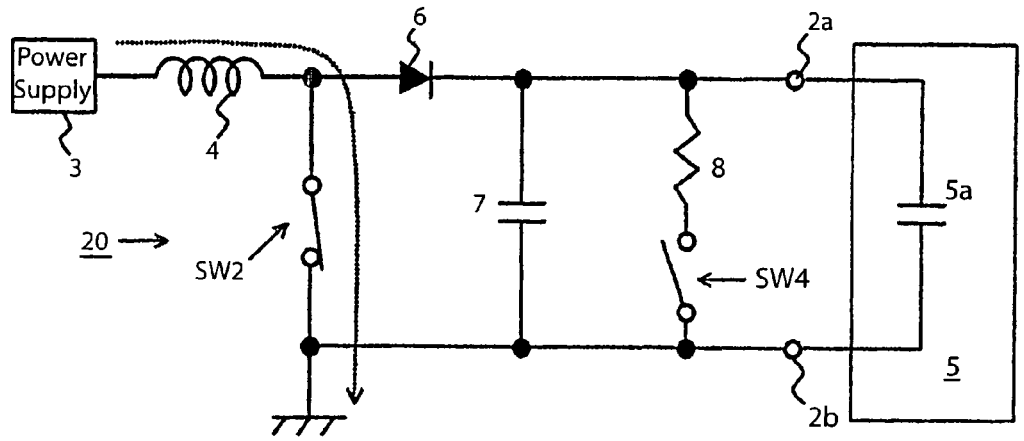
FIG. 2(a)–(b) depict an operating principle of the wave-shaping circuit of FIG. 1.
Figure 2B:
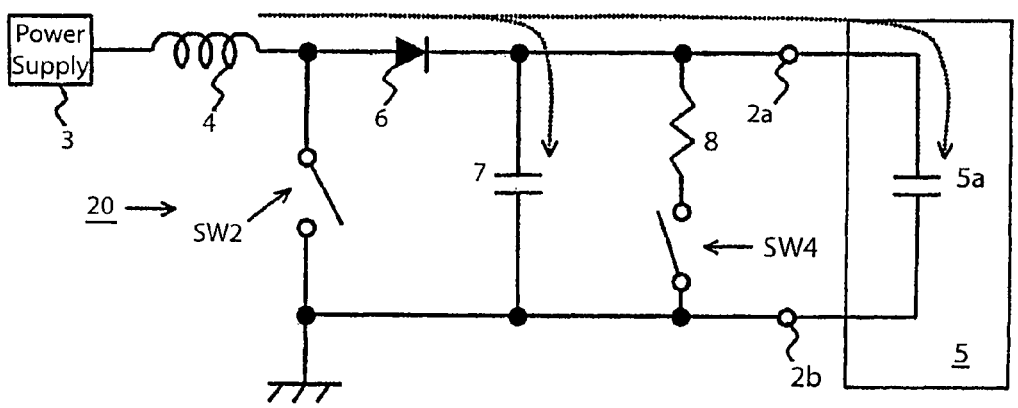
Figure 3:
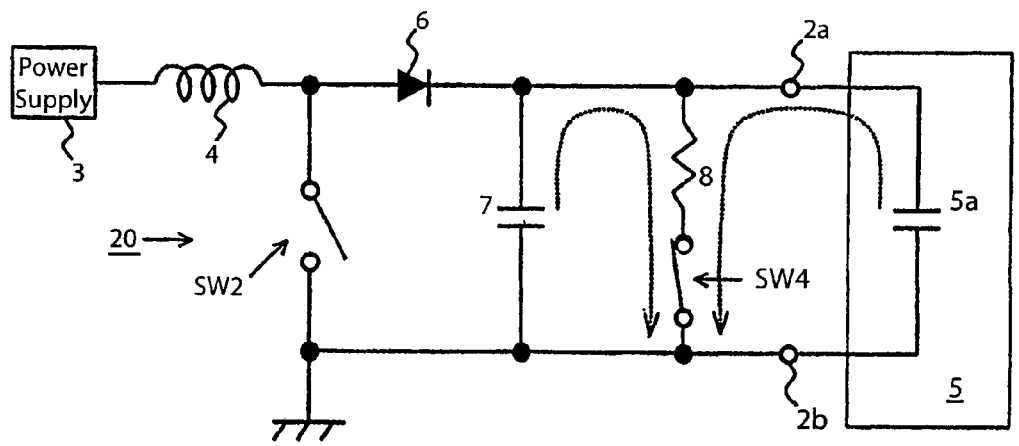
FIG. 3 depicts another operating principle of the wave-shaping circuit of FIG. 1.

To explain the use of this PWM signal, the principles involved in the operation of the wave-shaping circuit 20 will be described using FIGS. 2(a), 2(b) and 3, in which circuit elements identical to those from FIG. 1 are assigned like numerals. FIG. 2(a) and FIG. 2(b) are circuit diagrams for the purpose of describing the operations of forming an upwardly sloping output potential between the output terminals 2a, 2b. FIG. 3 is a circuit diagram for the purpose of describing the operations of forming a downwardly sloping output potential between the output terminals 2a, 2b.

FIGS. 2(a), 2(b) and 3 illustrate a low-potential DC power supply 3 that supplies a DC power (e.g., approximately 5 V), an inductor coil 4, and a charging switch SW2 that is connected, along with the coil 4, in series with the low-potential DC power supply 3. Also, a diode 6 and a capacitor 6, connected in series, is connected in parallel with the charging switch SW2. The diode 6 is a reverse current preventing element with a forward current direction going from the coil 4 to the capacitor 7. When the capacitor 7 is charged, discharge current from the charge potential is prevented from flowing in reverse from the capacitor 7 to the coil 4.

A discharge resistor 8 and a discharge switch SW4, connected in series, are connected to the terminals of the capacitor 7. The terminals of the capacitor 7 serve as the output terminals 2a, 2b connected to the circuit part 5.

To form an upwardly sloping output potential at the output terminals 2a, 2b, the discharge switch SW4 is kept open. In this state, as shown in FIG. 2(a), when the discharge switch SW2 is closed, current flows through the coil 4 in the direction shown by the arrow in the figure. This current increases with time after the charging switch SW2 is closed.

After a predetermined time, the charging switch SW2 is opened to stop the current flowing to the coil 4. A counterelectromotive force is then generated to try to continue the current flow through the coil 4. The potential of this counterelectromotive force is dependent on an internal resistance not shown in the figure of the circuit part 5, which operates with the output potential connected by way of the diode 6. If this internal resistance is treated as a constant, its value is roughly proportional to the on time from the closing of the charging switch SW2 to its opening. Since the diode 6 has a forward direction from the coil 4 to the capacitor 7, the charge current flows in the direction indicated by the arrow in FIG. 2(b). The counterelectromotive force generated in the coil 4 charges the capacitor 7 and an internal capacitance 5a of the circuit part 5.

Then, as the opening and closing of the charging switch SW2 as described above is repeated, each time the current through the coil 4 is stopped by the opening of the charging switch SW2, the counterelectromotive force generated in the coil 4 causes the capacitor 7 and the internal capacitance 5a of the circuit part 5 to be charged, and the charge potential is increased from its prior value by the counterelectromotive force. While the charging switch SW2 is closed and current is flowing through the coil 4, the discharge current that tries to flow from the capacitor 7 and the internal capacitance 5a of the circuit part 5 is blocked by the diode 6 so that the charge potential is maintained.

During a single period, when the charge switch SW2 is closed and then opened, the increased charge potential is roughly equivalent to the counterelectromotive force generated when the charge switch SW2 is opened if the discharge current flowing through the internal resistance of the circuit 5 during this time and the charge potential already present are ignored. This counterelectromotive force is, as described before, roughly proportional to the "on" time from the closing of the charging switch SW2 to its opening.

More specifically, during a single period between the closing and subsequent opening of the charge switch SW2, the increase in the charge potential is determined by the "on" time of the closing operation of the charging switch SW2. By repeating this, the slope of the increase in the charge potential can be controlled. Also, the increase of this charge potential relative to the potential of the low-potential DC power supply 3 can be controlled.

Thus, the PWM signal with the fixed period Tc is used to open and close the charge switch SW2, with the switch being closed during periods when the PWM signal is at a first level and the switch being opened during remaining periods when the signal is at a second level. This varies the duty cycle of the PWM signal so that an output potential waveform with a desired upward slope can be provided between the output terminals 2a, 2b.

If a downwardly sloping output potential is to be formed, the charging switch SW2 is kept open, as shown in FIG. 3. When the discharge switch SW4 is closed from this state, as shown in FIG. 3, discharge current flows through the discharge resistor 8 in the direction indicated by the arrow in the figure. A charge potential $V_t$ of the capacitor 7 at a time t after the closing of the discharge switch SW4 can be expressed as the following function of elapsed time t:

$$V_t = V_o \times \varepsilon^{-\frac{t}{CR}}$$

where $V_0$ is the charge potential of the capacitor 7 before the switch is closed, C is the sum of the capacity of the capacitor 7 and the internal capacitance 5a of the circuit part 5, and R is the resistance of the discharge resistor 8.

More specifically, the drop in the charge potential is determined by the "on" time during which the discharge switch SW4 is closed. By repeating this operation within a predetermined interval, the downward slope between the output terminals 2a, 2b can be controlled. Thus, the PWM signal with the fixed period Tc is used to open and close the switch SW4, with the switch being closed during periods when the PWM signal is at a first level and the switch being opened during remaining periods of Tc when the signal is at a second level. This varies the duty cycle of the PWM signal so that an output potential waveform with a desired downward slope can be provided between the output terminals 2a, 2b.

Figures 4, 5:
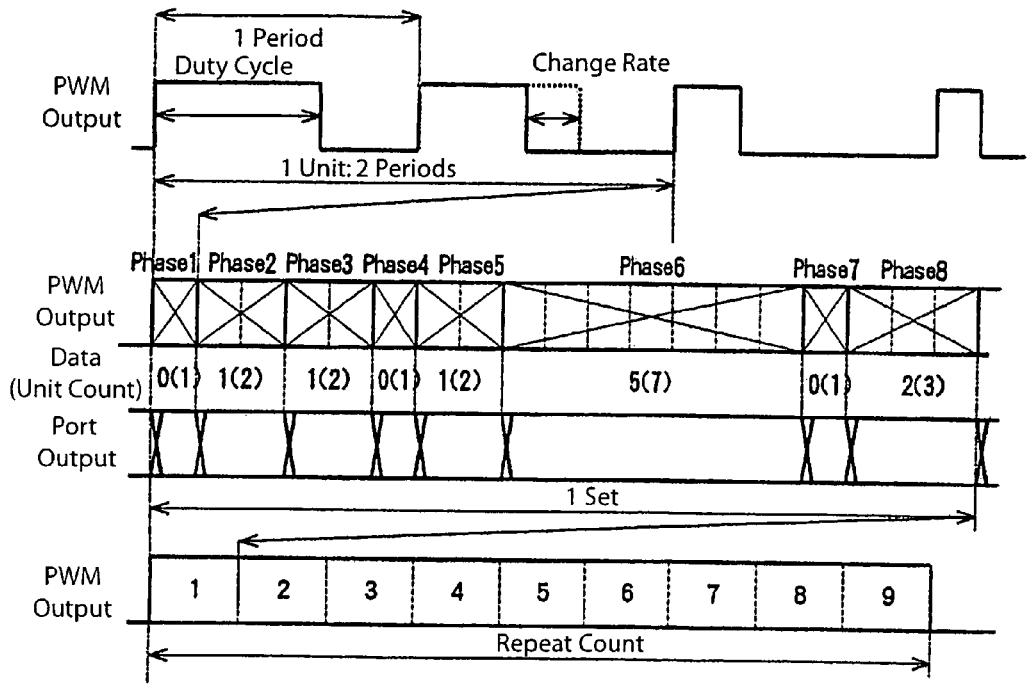
FIG. 4 illustrates an embodiment of a signal format of a pulse width modulation signal to be generated.
FIG. 5 illustrates an embodiment of a data table stored in a RAM.

Based on these operational principles, the wave-shaping circuit 20 in FIG. 1 uses PWM signals with duty cycles adjusted to predetermined values to adjust the opening and closing times of the charging switch SW2 and the discharging switch SW4. As a result, a +/−100 V sine-wave potential waveform is formed between the output terminals 2a, 2b from a 5 V DC potential. However, since the opening and closing of the charging switch SW2 and the discharging switch SW4 are controlled with a PWM signal formed from a series of unit pulse signals that change at a fixed duty change rate, it is not possible to use one type of PWM signal to form a single sine wave period. Thus, a single sine wave period is divided into 8 sections, and different types of PWM signals are generated for a Phase 1 through a Phase 8 as shown in FIG. 4. The PWM signal is formed as a series of signals for the different phases.

The controller 1 that generates the PWM signal is equipped, as shown in FIG. 1, with the following elements, which are connected to each other by a bus line: a CPU 10; a RAM 11; a ROM 12; a period timer 13; a PWM timer 14; a PWM signal output circuit 15 that outputs a PWM signal with the signal format shown in FIG. 4; and a port signal output circuit 16 that outputs from a port P0 through a port P3 switch control signals that control the switches SW1, SW3, SW5, and SW6.

Figure 8:
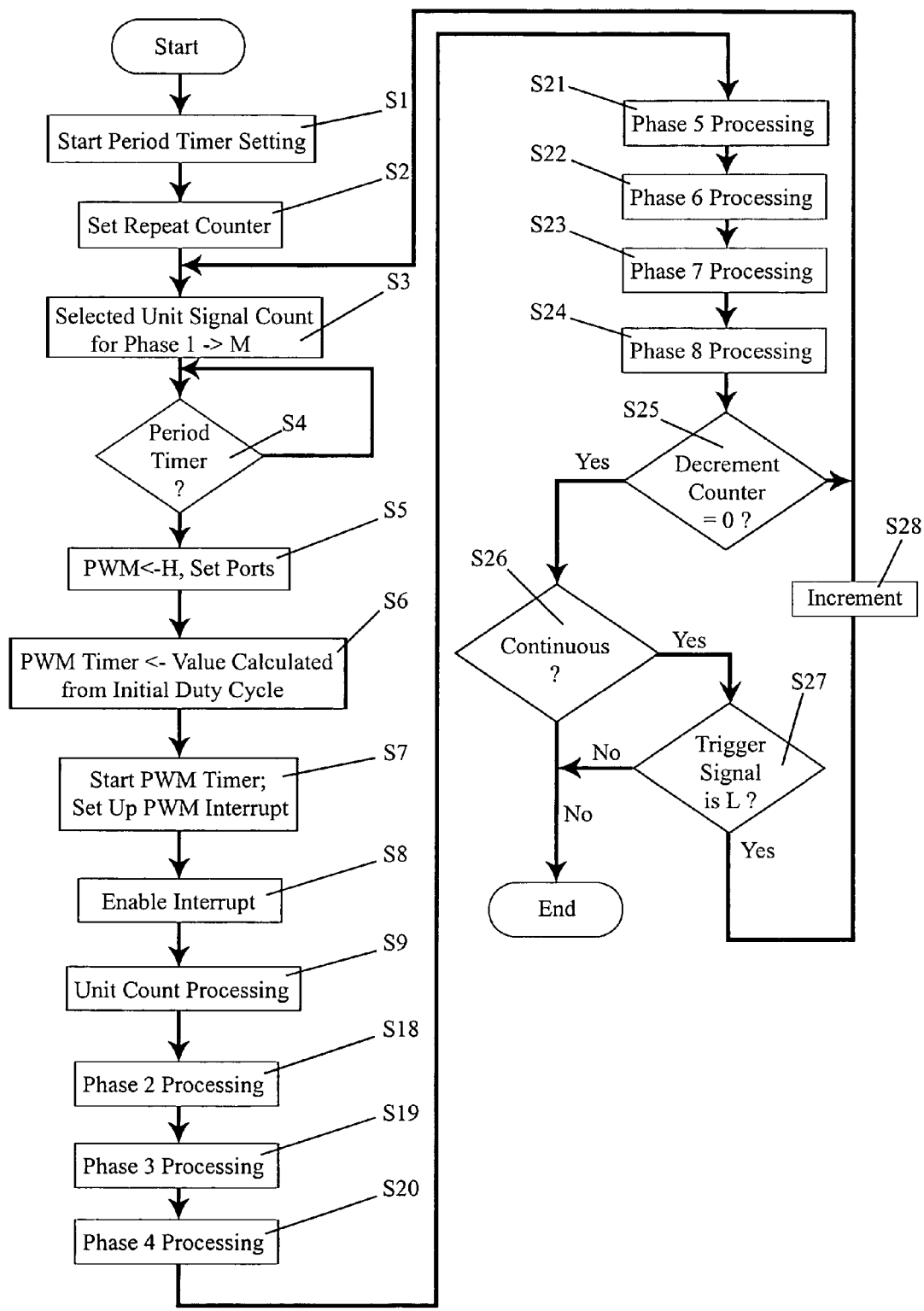
FIG. 8 illustrates one embodiment of a process for generating a pulse width modulation signal from Phase 1 through Phase 8.
Figure 9B:
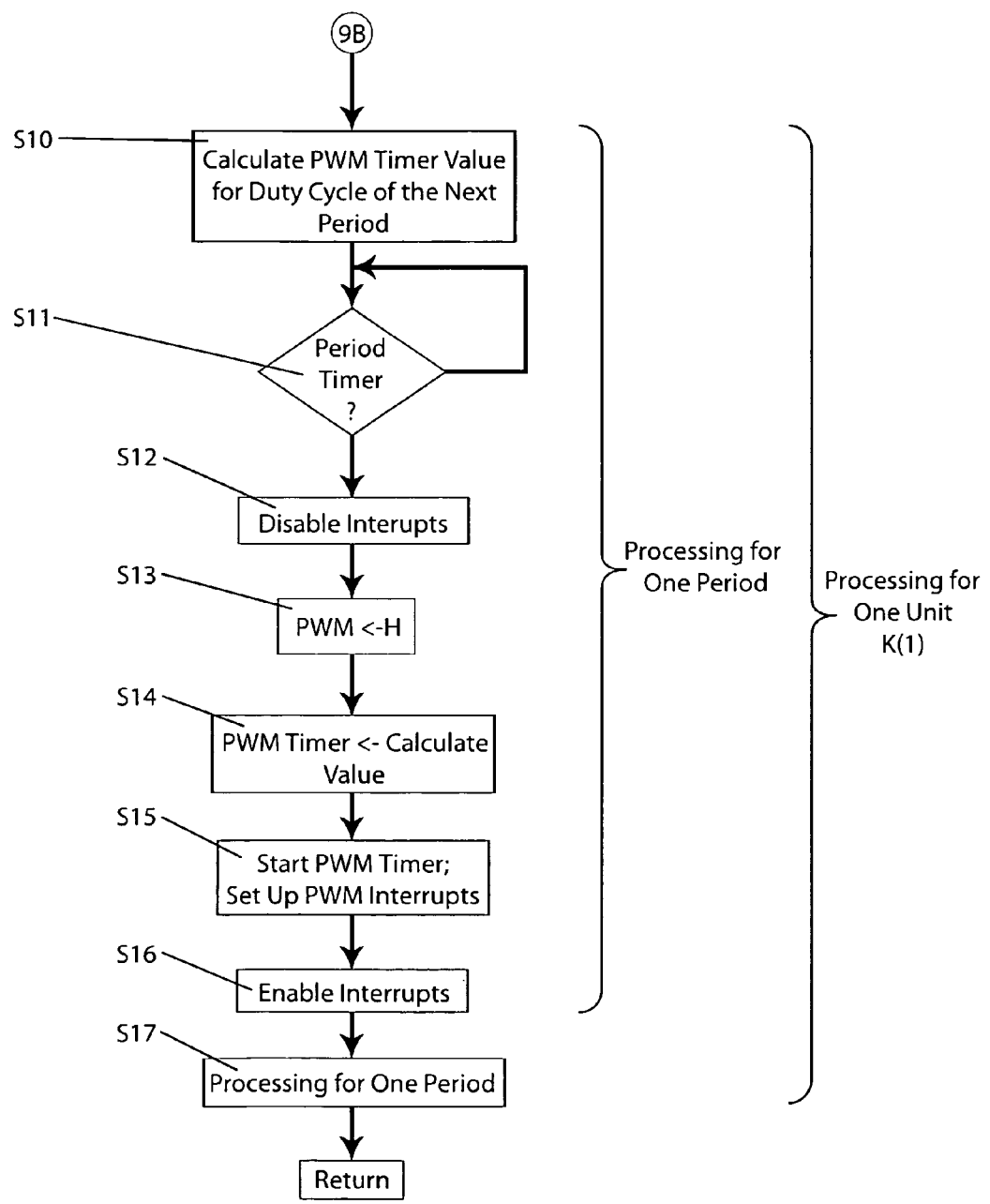
Figure 10:
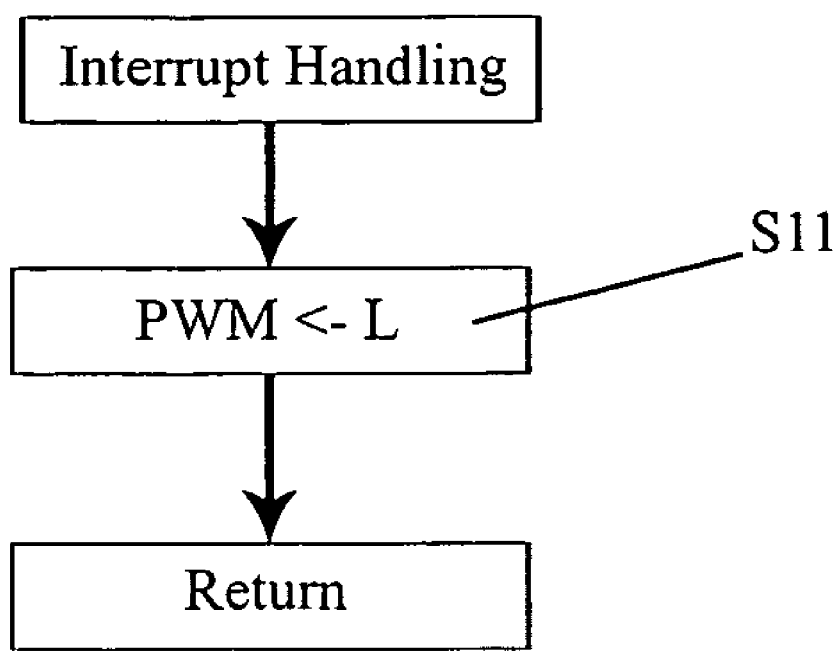
FIG. 10 illustrates a subroutine that performs interrupt handling in the process of FIG. 8.

The ROM 12 stores a program that operates a CPU 10 according to the flowcharts shown in FIG. 8 through FIG. 10, the data format shown in FIG. 6, and the like. Also, the RAM 11 stores the data table shown in FIG. 5, signal modulation data formed from 17-byte units based on the data format shown in FIG. 6, and the like. The signal modulation data is used to repeatedly generate 8-phase PWM signals.

The data table in FIG. 5 contains 16 types of data, each represented by 4 bits, indicating the pulse period and repeat count for the generated PWM signal, as well as, for each phase, the initial duty cycle, the duty change rate, and the number of units forming one phase for the PWM signal.

As the data format in FIG. 6 shows, out of these settings, the pulse period and the repeat count for the PWM signal are defined by one set of settings that stays the same for the generated PWM signal. The initial duty cycle, the duty change rate, and the number of units in each phase, Phase 1 through Phase 8, are selected from 16 settings. The generated PWM signal is defined by selecting individual settings from the variables in the data table.

The pulse period is one period of the unit pulse signal shown in FIG. 4. A period of between 48 microseconds and 480 microseconds is selected, and this determines the fixed period Tc for 1 phase. For example, if the data for 48 microseconds is selected, a PWM signal of 20.80 kHz is generated. The repetition count indicates the number of times a PWM signal from Phase 1 to Phase 8 is repeated, as shown in FIG. 4. If the repetition count is to be unlimited, "continuous" in the 0h data is selected.

As shown in FIG. 4, each of the unit pulse signals that form the PWM signal is formed from a first level, which is an "H" level, and a second level, which is an "L" level that is continuous with the "H" level. Selecting a predetermined initial duty cycle and a duty change rate from predetermined settings in the data table defines all the duty cycles, which is defined as the "H" level time width relative to the fixed period Tc * 100%, from the first unit pulse signal in Phase 1 to the final unit pulse signal.

The maximum initial duty cycle setting in the data table is 60%, but it would also be possible to use other values, with 100% being the upper limit. Since there is also the need to continuously reduce the duty cycle within a single phase in the PWM signal, negative values are also included. The settings are selected so that the final unit pulse in a phase does not fall outside of the duty cycle range of 0% to 100%. In this case, as described later, the range is set to 0% to 90%.

The length of a single phase in the PWM signal is determined by the number of units that form the phase. As shown in FIG. 4, a pair of continuous unit pulse signals form one unit, so the length of one phase can be expressed as fixed period Tc * the unit count selected from the data table * 2 microseconds. For example, Phase 2 is formed from 2 units and Phase 6 is formed from 7 units. Since the duty cycle of continuous unit pulse signals in one phase changes according to the fixed duty change rate, the number of units forming one phase can be adjusted so that the duty cycle of the final unit pulse signal in one phase can take on various different values.

In this embodiment, the data format restricts the unit count in one phase to 4 bits, i.e., 16 types. In these 16 settings, the smaller settings can be set up so that difference between settings is narrower, thus allowing finer length adjustments. If the settings are larger, the difference between settings can be made larger to make changes clearly identifiable.

More specifically, settings are made using the positive integer approximations of an exponential function $F(x)=1.321279^x$, where x is a positive integer. The 16 items of data are sorted from a smallest value $K(1)$ to a maximum value $K(16)$, with the difference $d(n)$ between the n-th data $K(n)$ (where n is a positive integer of 2 or more) and the (n−1)-th data $K(n-1)$ being indicated in one of the date settings at n−1 or below.

TABLE 1

| x | F(x) | Approximation of F(x) | n | K(n) | d(n) = K(n) − K(n − 1) |
|---|---|---|---|---|---|
| 1 | 1.321279 | 1 | 1 | 1 | |
| 2 | 1.745778 | 2 | 2 | 2 | 1 |
| 3 | 2.306660 | 2 | | | |
| 4 | 3.047742 | 3 | 3 | 3 | 1 |
| 5 | 4.026917 | 4 | 4 | 4 | 1 |
| 6 | 5.320681 | 5 | 5 | 5 | 1 |
| 7 | 7.030104 | 7 | 6 | 7 | 2 |
| 8 | 9.288728 | 9 | 7 | 9 | 2 |
| 9 | 12.273002 | 12 | 8 | 12 | 3 |
| 10 | 16.216059 | 16 | 9 | 16 | 4 |
| 11 | 21.425939 | 21 | 10 | 21 | 5 |
| 12 | 28.309643 | 28 | 11 | 28 | 7 |
| 13 | 37.404937 | 37 | 12 | 37 | 9 |
| 14 | 49.422357 | 49 | 13 | 49 | 12 |
| 15 | 65.300723 | 65 | 14 | 65 | 16 |
| 16 | 86.280474 | 86 | 15 | 86 | 21 |
| 17 | 114.000578 | 114 | 16 | 114 | 28 |

Table 1 shows, for x=2 and x=3, the exponential function $F(x)=1.321279^x$ results in the same approximation of 2. The approximation for x=3 is eliminated, and the approximations for x=1 to x=17 are used as settings to provide 16 settings. These settings are arranged from smallest to larges, with the setting $K(n)$ being the n-th setting from the smallest value (n is a positive integer from 1 to 16). The smallest value $K(1)$ is 1 and the largest value $K(16)$ is 114. Each difference $d(n)$ between a data $K(n)$ and the (n−1)-th data $K(n-1)$, where n is a positive integer of 2 or more, is represented in one of the data settings at n−1 or lower.

Since the difference $d(n)$ with the setting with the previous magnitude is represented in another lower setting, a step for generating a phase of a pulse-width modulation signal that reads a selected unit count can take advantage of the generation of another pulse width modulation signal in which only the selected unit count is different. This greatly simplifies the overall process for generating signals.

The values set up for the different variables in the data table can be stored in an external EEPROM (electrically erasable programmable read-only memory) 17 connected to the controller 1, and the data table can be generated by reading the different variable settings for the PWM signal to be generated.

As shown in FIG. 1, the wave-shaping circuit 20 includes: four switches SW1, SW3, SW5, SW6 opened and closed by switch control signals output from the ports P0, P1, P2, P3 of the controller 1; and two switches (SW2, SW4) opened and closed by PWM signals output from the PWM terminal.

Out of these switches, the switch SW2 and the switch SW4 are closed when the PWM signal is at the first level (in this example, the "H" level) and opened when the PWM signal is at the second level (in this example, the "L" level).

The switch SW1 and the switch SW3 are closed when there is an "H"-level control signal from the port P2 and the port P3 and are opened when there is an "L"-level control signal.

The common terminal of the switch SW5 serves as a first output terminal 2a that connects to the circuit section 5, and the common terminal of the switch SW6 serves as a second output terminal 2b that connects to the circuit section 5. Selector terminals 2aA, 2aB of the switch SW5 that select the connection to the output terminal 2a are electrically connected respectively to a high-potential electrode 7a and a ground electrode 7b, which are the two terminals of the capacitor 7. Similarly, selector terminals 2bA, 2bB of the switch SW6 of the switch SW6 that selects the connection to the output terminal 2b are electrically connected respectively to a high-potential electrode 7a and a ground electrode 7b, which are the two terminals of the capacitor 7.

The switch SW5 and the switch SW6 are controlled by control signals output from the port P0 and the port P1 respectively. When an "H"-level control signal is output, the common terminals 2a, 2b are connected to the selector terminals 2aA, 2bA connected to the high-potential electrode 7a, and when an "L"-level control signal is output, the common terminals 2a, 2b are connected to the selector terminals 2aB, 2bB connected to the ground electrode 7b.

As the data format in FIG. 6 shows, for each phase, the switch control signals output from the ports P0, P1, P2, P3 are determined by values selected from the data table for the corresponding phase. The switching operations of the switches SW1, SW3, SW6 described above are set up for each separate phase.

The circuit section 5 connected to the output terminals 2a, 2b is a piezoelectric substrate used as a vibration source that vibrates when a touch-panel input device detects a pressure position. The output terminals 2a, 2b are connected to a pair of electrodes on the piezoelectric substrate 5. When a sine wave drive potential of approximately +/−10 V is generated at the output terminals 2a, 2b, the piezoelectric substrate 5 vibrates so that the touch panel is vibrated, thus indicating to an operator via the operator's finger touching the touch panel, that the pressure position was detected.

The following description will present how the controller 1, described above, generates eight types of PWM signals from Phase 1 through Phase 8, and how these PWM signals are used by the wave-shaping circuit 20 to form a sine-wave output potential shown in FIG. 11(h) at the output terminals 2a, 2b.

In order to generate PWM signals and switch control signals for this purpose, the RAM 11 of the controller 1 stores 17 bytes of data read from the data table in FIG. 5: "19, 59, 65, 59, 65, F2, 87, 55, A0, 72, 99, F2, 87, 66, A0, 72, AA"h. This data is stored according to the data format shown in FIG. 6.

For example, the high-order 4 bits of the first byte is 1h, which indicates that a fixed period Tc of 48 microseconds is used for Phase 1 through Phase 8. The low-order 4 bits of the first byte is 9h, indicating that the PWM signal is repeated 9 times.

The Phase 1 PWM signal to be generated is defined by the 9h in the low-order 4 bits of byte 2, the 2h in the low-order 4 bits of byte 6, and the 7h in the low-order 4 bits of byte 7, which represent the selected unit count, the selected initial duty cycle, and the selected duty change rate from the data table respectively. More specifically, the number of units forming Phase 1 is 21, represented by the selected unit count 9h out of the 16 types of settings in the duty table, the initial duty cycle is 8%, represented by the 2h read from the data table, the and the duty change rate is 3.5%, represented by the 7h read from the data table.

Similarly, for the PWM signals for Phase 2 through Phase 8, the corresponding selected unit counts, selected initial duty cycles, and the selected duty change rates read from the data table in FIG. 5 are represented in the signal modulation data stored at corresponding addresses in the data format in FIG. 6 (see FIG. 7). The PWM signals for Phase 2 through Phase 8 are generated according to these selected values.

The signal modulation data also includes port polarity data, which determines switch control signal levels output from port P0 through P3 for each phase, in 4 bits of data at byte 8, byte 11, byte 14, and byte 17 of the data format shown in FIG. 6. The port polarity data, consisting of 4 bits, uses "1" to indicate an "H" level and "0" to indicate an "L" level, and represents, starting from the high-order bits, switch control signal levels for P3, P2, P1, P0. For example, the port polarity data for Phase 4 is represented 9h, i.e., "1001", in the high-order 4 bits in byte 11 of the signal modulation data. The switch control signal levels output from P3, P2, P1, P0 in Phase 4 are "H", "L", "L", "H", respectively (see FIG. 7).

FIG. 8 through FIG. 10 are flowcharts showing the steps used for the controller 1 to repeatedly generate PWM signals. A method for continuously generating PWM signals for Phase 1 through Phase 8 according to the selected values above will be described, with references to the flowcharts in FIG. 8 through FIG. 10.

First, the CPU 10 sets the period of the period timer 13 to the fixed period Tc of 48 microseconds (step S1). The repeat counter, which is a software counter, is set to 9, which is the repeat count for the PWM signal (step S2). A jump point M for a subroutine described later is set to 21, the selected unit count for Phase 1 (step S3).

Next, the period timer 13 stands by until the fixed period 48 microseconds is counter (step S4). When the fixed period 48 microseconds is counted, an instruction to set the PWM signal output level to "H" is output to the PWM signal output circuit 15, the port polarity data "0101" contained in the signal modulation data is output to the port signal output circuit 16, and the output levels for the ports P0, P1, P2, P3 are set to "H", "L", "H", and "L" (step S5). Also, the period timer 13 is reset and the count for the fixed period 48 microseconds is restarted.

Roughly simultaneously to this step S5, the product of the fixed period 48 microseconds and the selected initial duty cycle 8% is set up as the period for the PWM timer 14 to define the time width for the "H" level (first level) of the first unit pulse signal in Phase 1. The PWM timer 14 is started, and the interrupt for the PWM timer 14 is set up (step S7).

The interrupts from the PWM timer 14 are set up so that when the PWM timer 14 has counted to the calculated value, an interrupt request signal is output to the CPU 10. If the CPU 10 receives an interrupt request signal between the enabling of interrupts and the disabling of interrupts, described below, operations are interrupted and the interrupt handling operation indicated in FIG. 10 is executed. More specifically, in this interrupt handling operation, an instruction that sets the output level of the PWM signal to "L" is output to the PWM signal output circuit 15 (step S11), and then the interrupted operation is resumed. This initiates period timer 13, and the unit pulse signal initiated at the "H" level changes to the "L" level when the "H"-level time defined by the calculated value has elapsed. This generates a pulse width that has the duty cycle (the selected initial duty cycle for interrupts subsequent to step S7) set up for the unit pulse signal.

At step S8, interrupts are enabled so that the interrupt handling described above can be performed once the PWM timer 14 is started. Then, control proceeds to the subroutine the performs processing according to the unit count shown in FIG. 9 (step S9).

The unit count processing subroutine is executed from a jump point corresponding to the selected unit count M for that phase and is set up so that a subroutine for generating one unit of the PWM signal is repeated by a number of iterations determined by the selected unit count.

The values that the selected unit count M can take on are the 16 possible settings set up in the "phase unit count" field of the data table shown in FIG. 5, i.e., the values K(n) in Table 1. As shown in FIG. 9, the unit count processing subroutine is formed from a K(1) subroutine that generates a 1-unit PWM signal. Upstream from this K(1) subroutine are K(n) subroutines, where n is from 2 to 16, and each K(n) subroutine is a jump point for when the selected unit count is K(n).

For the K(2) subroutine to the K(16) subroutine, if d(n), the difference K(n)–K(n–1), is K(1), i.e., 1, then the jump point is defined as the K(1) subroutine. As Table 1 shows, the K(n) for which d(n) is 1 are when n=2, 3, 4, 5. Thus, the jump points for the K(2) subroutine to the K(5) subroutine are the K(1) subroutine.

If d(n), the difference K(n)–K(n–1), is an integer other than 1, the jump point for the K(n) subroutine is the jump point for when the selected unit count M is d(n). More specifically, an integer n' where d(n) is equal to K(n') is determined, and the K(n') subroutine, which would be the jump point when the selected unit count M is K(n'), is the jump point for the K(n) subroutine. For example, if the selected unit count M is 37 (K(12)), then, for the K(12) subroutine, Table shows that d(12) is 9, and the n' that provides a K(n') of 9 is 7. Thus, the jump point for the K(12) subroutine is defined as the K(7) subroutine, which is the jump point for when the selected unit count M is K(7).

Jump points are defined for all K(n) subroutines for values of n from 2 to 16 arranged upstream from the execution flow of the K(1) subroutine. As a result, for a K(n) subroutine, the K(1) subroutine is executed d(n) (K(n)–K(n–1)) times from a subroutine downstream from its entry point and then control proceeds to the K(n–1) subroutine, which is one element downstream in the execution flow.

Similarly, for the K(n–1) subroutine, the K(1) subroutine is executed d(n–1) via its jump point subroutine, after which control proceeds to a subroutine that is downstream from it in the execution flow. Control proceeds finally to the K(1) subroutine furthermost downstream, where the K(1) subroutine is executed once, completing the unit count processing execution flow (subroutine).

In other words, by setting up the jump point for K(n) for the selected unit count M as K(n), the unit count processing subroutine provides $$K(1) + \sum_{i=2}^{n} d(i)$$

iterations, i.e., the K(1) subroutine for generating one unit of the PWM signal is repeated K(n) times.

As a result, no matter which of the N possible values the selected unit count M is, a program can be set up with a K(1) subroutine that repeats the signal step only K(1) times, i.e., the minimum value. By defining, upstream from the execution flow, jump points for K(n) subroutines for other selected unit signal counts K(n), the program can repeat the signal generating step by an iteration count corresponding to the selected unit count.

As a result, for any data table setting for the selected unit count of a phase, the unit count processing subroutine need essentially only provide a subroutine K(1) that generates a one-unit PWM signal, while defining jump points for upstream subroutines K(n) that use the shared subroutine K(1) to repeat an operation by the selected unit count. This results in a program size that is 1/100 of that of a program which contains multiple subroutine K(1) programs for each selected unit count setting. The program size is also 1/5 of that of a program which, for each setting in the data table, jumps repeatedly to a shared subroutine K(1).

Returning to the description of how the PWM signal is generated, at step S3, the selected unit count M for phase 1 was 21, so at step S9, the unit count processing subroutine jump point is the K(10) subroutine. The jump point for the K(10) subroutine is the K(5) subroutine, and, in turn, the jump point of the K(5) subroutine is the K(1) subroutine. This K(1) subroutine generates a unit signal formed from a pair of continuous unit pulse signals.

In the operation that follows step S9, the K(1) subroutine generates, for Phase 1, a first unit pulse signal and the a second unit pulse signal continuous therewith, but first the duty cycle for the second unit pulse signal is determined by calculating a value to set as the period for the PWM timer 14 (step S10) before the period timer 13 counts up to the fixed period Tc (step S11). This calculated value will be the fixed period 48 microsec multiplied by an 11.5% duty cycle, which is the sum of the selected initial duty cycle 8% and the selected duty change rate 3.5%.

The program enters standby state until the period timer 13 counts to the fixed period Tc (step S11). When the fixed period Tc is counted, interrupts from the PWM timer 14 are disabled (step S12). An instruction for setting the PWM signal output level to "H" is sent to the PWM signal output circuit 15 (step S13). The period timer 13 is then reset and the counting of the fixed period 48 microsec is restarted. At this point, a first unit pulse signal with the selected initial duty cycle 8% is generated, and the generation of the continuous second unit pulse signal is started.

At roughly the same time, in order to define the time width for the "H" level (first level) in the second unit pulse signal for Phase 1, the value calculated in step S10 is set up as the period for the PWM timer 14 (step S14), the PWM timer 14 is started, and an interrupt from the PWM timer 14 is set up (step S15). Then, the disabling of interrupts at step S12 is released to enable interrupts (step S16).

In the operations from step S10 to step S16 described above, a periodic operation working at a fixed period of 48 microsec is executed, and during this time, unit pulse signals are generated. In the K(1) subroutine, a periodic operation identical to the one from step S10 to step S16 (step S17) is repeated to generate a unit signal formed from a pair of unit pulse signals. More specifically, in the periodic operation at step S17, even-number unit pulse signals are generated and the generation of the subsequent odd-number unit pulse signal is started, and the PWM timer 14, which determines the duty cycle, is started.

When the first unit signal is generated by executing the K(1) subroutine in this manner, control returns to the K(5) subroutine, where it proceeds to the K(4) subroutine downstream from it. The jump point of the K(4) subroutine is also the K(1) subroutine, so the K(1) subroutine is executed and the second unit signal following the first is generated. In a similar manner, the K(3) subroutine, the K(1) subroutine, the K(2) subroutine, the K(1) subroutine, and the K(1) subroutine are executed. Once the fifth unit signal has been generated, control returns to the K(10) subroutine, where it proceeds to the K(9) subroutine downstream from it.

Between the K(10) subroutine, which was the initial jump point, to the jump to the K(9) subroutine downstream from it, the K(1) subroutine is executed 5 times, corresponding to d(10), which is the difference between K(10) and K(9). Similarly, between the completion of execution of the subroutine jumped to from the downstream K(9) subroutine and the jump to the downstream K(8) subroutine, the K(1) subroutine is executed 4 times, corresponding to d(9).

This is executed until control reaches the K(1) subroutine furthest downstream, resulting in the execution of the K(1) subroutine 21 times, which is the selected unit count M for Phase 1, and the generation of a Phase 1 PWM signal, formed from 21 unit signals. Control then returns to the Phase 2 operation (step S18) shown in FIG. 8.

The operations from step S3 to step S9 for Phase 1 are in common with the Phase 2 through Phase 8 operations (step S18 through step S24), which generate the PWM signals for each phase. By continuously executing the operations for Phase 2 through Phase 8 in sequence, the selected unit count, PWM signals are generated continuously for each phase with the selected unit counts, the selected initial duty cycles, and the selected duty change rates shown in FIG. 7. Also, each time there is a switch in phases, the port polarity data contained in the signal modulation data is sent to the port signal output circuit 16 so that the output levels of the ports P0, P1, P2, P3 are set up each time there is a phase switch.

When the Phase 8 operation at step S24 is executed, a PWM signal formed continuously from Phase 1 to Phase 8 is output from the PWM terminal. The repeat count of 9 in the repeat counter set at step S2 is decremented to 8, and the operations from step S3 are repeated to process Phase 1 through Phase 8 until the repeat counter reaches 0 (step S25). The generation of the PWM signal from Phase 1 through Phase 8 is repeated 9 times, based on the data 9$h$ indicated in the lower 4 bits of the first byte of the signal modulation data. Then, the data is checked to see if it is 0$h$, indicating "continuous" (step S26). Since the data does not indicate it, the operation is terminated.

If the lower 4 bits of the first byte of the signal modulation data is set to 0$h$ so that the PWM signal from Phase 1 through Phase 8 is to be continuously generated until the trigger signal becomes "H", then the repeat count in the repeat counter in step S2 is set to 1.

As a result, when the operations from Phase 1 through Phase 8 have been executed, the repeat count at step S25 becomes 0, so control proceeds to step S26, where an evaluation is made as to whether the signal is to be continuous or not. Then, control proceeds from step S26 to step S27, which checks the trigger signal level. Here, for example, a continuously generated PWM signal can be stopped by input from an operator, and the input would set the trigger signal level to "H".

If there is no input from the operator, the trigger signal level is "L", and the repeat count is restored from 0 to 1 at step S28, and the operations from step S2 are repeated.

If there is operator input during this time, step S27 detects the "H" level of the trigger signal and the continuous processing is terminated.

Next will be described the operation of the wave-shaping circuit 20, which uses the PWM signals for the different phases and switch control signals from the PWM terminal of the controller 1 and the ports P0, P1, P2, P3 to generate a sine wave potential waveform between the output terminals 2$a$, 2$b$.

Figure 11:
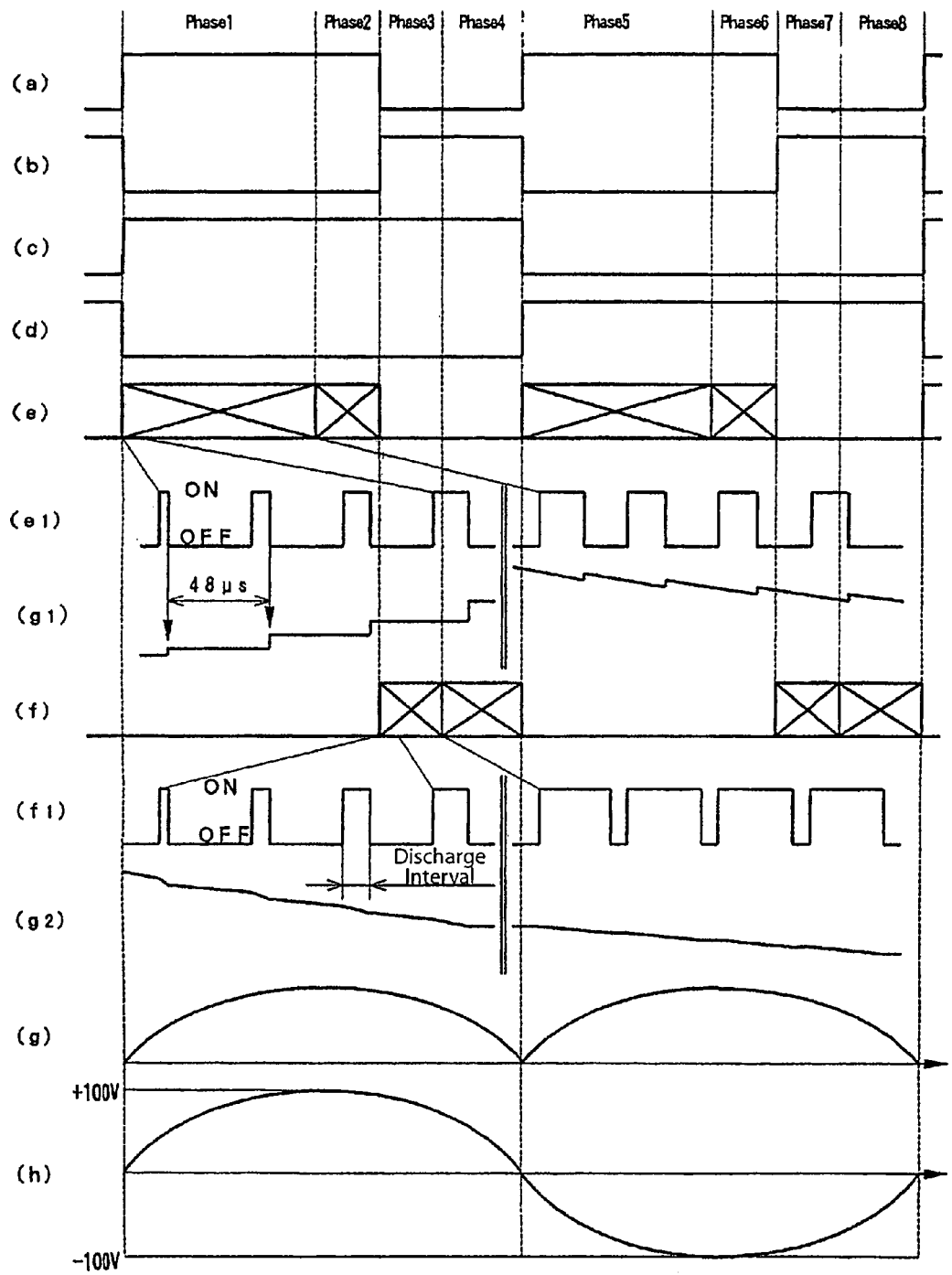
FIG. 11 depicts a waveform diagram for waveforms from sections (a) through (h) in the wave-shaping circuit of FIG. 1 from Phase 1 through Phase 8.
Figure 12:
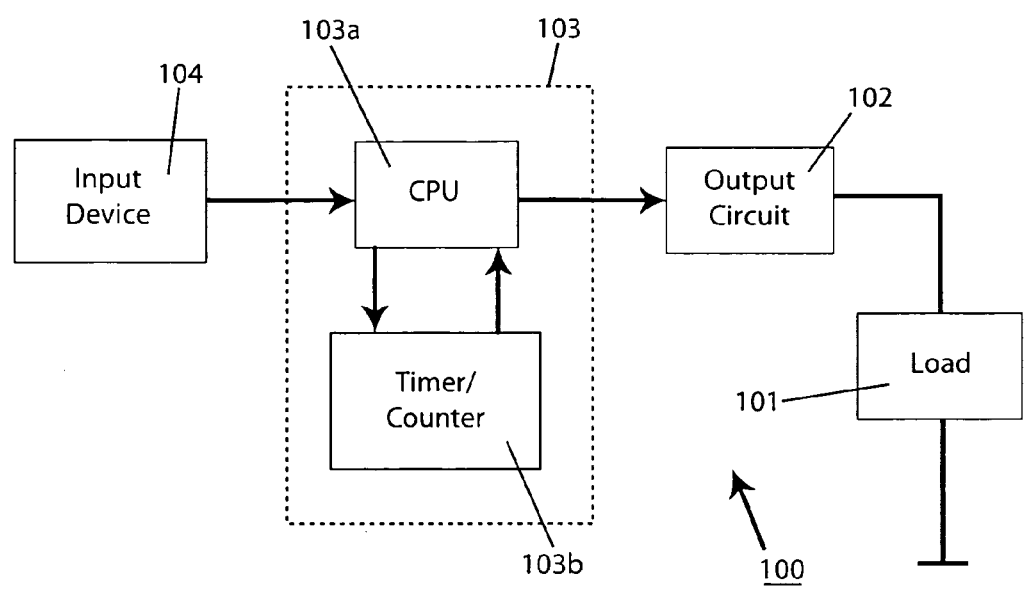
FIG. 12 is a schematic diagram depicting a conventional pulse width modulation signal generating device.
Figure 13:
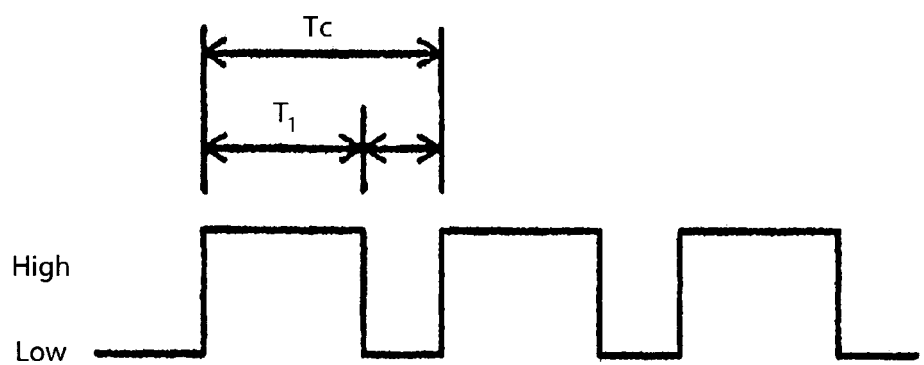
FIG. 13 depicts a waveform diagram for a PWM signal output from the device of FIG. 12.

In Phase 1 and Phase 2, the potential waveform is formed from the zero-cross position to the slightly past the maximum value in the sine potential waveform shown in FIG. 11($h$). As FIG. 7 and FIG. 11($a$) through ($d$) show, the switch control signals from the ports P0, P2 are set to "H", the switch control signals output from the ports P1, P3 are set to "L", the switch SW1 is closed, the switch SW3 is opened, the common terminal 2$a$ of the switch SW5 is switched to the selector terminal 2$a$A, and the common terminal 2$b$ of the switch SW6 is switched to selector terminal 2$b$B (see FIG. 3).

As a result, the switch SW2 is opened and closed by the PWM signal output from the PWM terminal while the discharge resistor 8 is disconnected from connection to the capacitor 7. Each time the switch SW2 is opened and closed, the capacitor 7 is charged again.

The PWM signal output in Phase 1 has a length of 21 unit signals. Since each unit has a length of 96 microsec, the total length is approximately 2 msec. The pulse width and pulse resting width of the PWM signal for each period is set up so that the charge potential of the capacitor 7 increases from the zero-cross position to the maximum value along a sine waveform.

The terminals of the capacitor 7 are connected to the output terminals 2$a$, 2$b$ connected to the piezoelectric substrate 5 so that a discharge current flows through the internal resistance of the piezoelectric substrate 5 continuously, including when charge operations are taking place repeatedly, and the charge potential of the capacitor 7 tries to drop (this downward reduction will be referred to as natural discharge). Even if the same counterelectromotive force is generated in the coil 4, the increase in the charge potential is dependent on the charge potential so that when the charge potential is low it will increase easily but when the charge potential is high it will tend to increase less.

Thus, in order to have the potential waveform of the charge potential form an upwardly sloping sine waveform, when the charge potential is low a PWM signal with a small duty cycle is used to keep the on time of the switch SW2 short. As the charge potential increases, the duty cycle must be gradually increased to make the on time of the switch SW2 longer, thus increasing the resulting counterelectromotive force. The selected duty change rate of the PWM signal output in Phase 1 is set to 3.5%, and as shown in the detail in FIG. 11($e$1), the duty cycle is increased at a fixed rate between unit pulse signals.

In calculations, the duty cycle of the PWM signal in Phase 1 will exceed 100% at a certain point, but the PWM signal output circuit 15 sets up a lower limit and upper limit of 0% to 90% for the duty cycles for all PWM signals. Thus, the PWM signal for Phase 1 maintains a duty cycle of 90% from the unit pulse signal at which a 90% duty cycle is reached to the final unit pulse signal of Phase 1.

By repeating the charging operation with the Phase 1 PWM signal, the high-potential electrode 7$a$ and the ground electrode 7$b$ of the capacitor 7 are charged to a charge potential of +100 V, as shown in FIG. 11($g$).

In Phase 2, which has a selected unit count of 7, a PWM signal with a length of 7 unit signals is output so that the charge potential waveform of the capacitor 7 follows a path from the maximum value of the sine waveform to a position where its slope matches the slope from natural discharge. More specifically, the charge potential drops during this period due to natural discharge, but since the waveform of the charge potential dropping due to natural discharge is lower than the waveform of a charge potential that would be continuous with the maximum value along a sine waveform, the PWM signal opens and closes the switch SW2 to repeatedly charge the capacitor 7 so that a charge potential that matches the sine wave is obtained.

In Phase 3 and Phase 4, the potential waveform of the charge potential is made to form a potential waveform going from the position where the slope of the sine potential waveform matches the slope of the natural discharge to the next zero-cross position. Based on the output during Phase 1 and Phase 2, the switch control signal of the port P3 is "H", the switch control signal of the port P2 is "L", the switch SW1 is opened, and the switch SW3 is closed.

As a result, the switch SW2 is disconnected from the PWM terminal while the switch SW4 is opened and closed by the PWM signal. When the switch SW4 is closed due to an "H"-level of the PWM signal, the charge potential of the capacitor 7 drops due to the discharge current flowing through the discharge resistor 8.

Since the piezoelectric substrate 5 connected to the output terminals 2a, 2b have an internal resistance of between 10M and 20M ohms and a large internal capacitance, during Phase 3 and Phase 4 the charge potential of the capacitor 7 does not drop quickly. Therefore, the duty cycle of the PWM signal used to open and close the switch SW4 is varied to adjust the time during which the discharge current flows through the discharge resistor 8, and the waveform of the charge potential (output potential) is made to match downward slope of the sine waveform.

In Phase 3, a PWM signal with a length of 7 unit signals is output to the switch SW4 so that the potential waveform of the charge potential waveform of the capacitor 7 is made to form a waveform that continuously approximates the sine waveform starting from the position where the slope of the sine potential waveform matches the slope of the natural discharge (the endpoint of Phase 2). The discharge resistor 8 is connected in parallel to the capacitor 7, and when the charge potential of the capacitor 7 is to be dropped, the decrease is easier when the charge potential is high and more difficult when the charge potential is low, which is the opposite from when charging was taking place. Therefore, the PWM signal in Phase 3 is given a duty cycle of 0% in the first period, and the duty cycle is increased at a selected duty change rate of 1.0% until the final period in Phase 3 (see FIG. 11(f1)).

Once the PWM signal in Phase 3 repeats the discharge operation so that the charge potential drops to a certain level, lowering the charge potential becomes more difficult as described above. Then, in the PWM signal in Phase 4, the selected initial duty cycle is set to 40%, which is significantly higher than the duty cycle of the PWM signal in Phase 3. The duty cycle is further increased by a selected duty change rate of 3.5% up to the final unit signal of the phase, which is made up of 9 unit signals.

When the discharge control by the PWM signal in Phase 4 is completed, the charge potential of the capacitor 7 has dropped to approximately 0 V. This provides a potential waveform at the terminals of the capacitor 7 that approximates a half wave of a sine waveform, as shown in FIG. 11(g). The common terminal (output terminal) 2a of the switch SW5 is connected to the selector terminal 2aA and the common terminal (output terminal) 2b of the switch SW6 connects to the selector terminal 2bB. Since the selector terminal 2bB is grounded, an output potential is formed between the output terminal 2a and the output terminal 2b that is a half wave of a sine potential waveform with the output terminal 2a as the "+" side.

From Phase 5 through Phase 8, a charge potential is formed between the terminals 7a, 7b of the capacitor 7 that is identical to the charge potential formed in Phase 1 through Phase 4. By switching the connections between the terminals 7a, 7b and the pair of output terminals 2a, 2b using the switches SW5, SW6, an output potential with a polarity that equal to and inverted from the charge potential of the capacitor 7 is formed between the pair of output terminals 2a, 2b, resulting in an output potential that is twice the charge potential of the capacitor 7.

Thus, unlike the output state of the control signals in Phase 1 through Phase 4, in Phase 5 through Phase 8, as shown in FIG. 11(c) (d), the switch control signal of the port P0 is set to "L", the switch control signal of the port P1 is set to "H", and the common terminal 2a of the switch SW5 is switched to the selector terminal 2aB and the common terminal 2b of the switch SW6 is switched to the selector terminal 2bA.

The other control signals for the switches and the PWM signals output from the PWM terminal are identical for Phase 5 to Phase 1, for Phase 6 to Phase 2, for Phase 7 to Phase 3, and for Phase 8 to Phase 4. As a result, from Phase 5 to Phase 8, a half wave sine potential waveform identical to the one from Phase 1 through Phase 4 is formed between the terminals 7a, 7b of the capacitor 7, as shown in FIG. 11(g).

As FIG. 11(h) shows, this results in an output potential between the output terminals 2a, 2b with a half wave sine potential waveform that has the output terminal 2a as the "−" side. By making this continuous with the output potential formed from Phase 1 through Phase 4, a sine waveform of +/−100 V is formed. By then repeating Phase 1 through Phase 8, an output potential with a sine waveform that oscillates for any amount of time can be obtained.

The piezoelectric substrate 12, which has its drive electrodes connected to the output terminals 2a, 2b, is vibrated with this +/−100 V sine waveform output potential serving as the drive power source, and this vibrates the touch panel secured thereto.

By forming modulation signal data from values selected from the settings in a data table as described above, the number of phases forming a single waveform, the PWM signals output for each phase, and switch control signals for each switch SW can be generated as desired. This makes it possible to use a single controller 1 and wave-shaping circuit 20 to form different types of output potential waveforms.

In the embodiment described above, the signal generating step generates unit signals formed from a pair of continuous unit pulse signals, but it would be possible for the unit pulse signals to be generated.

Also, the signal generation step executed in the K(1) subroutine is executed once, but the number of times is not necessarily limited to one as long as it is the minimum value K(1) in the N units of data stored in storage means. Thus, the number of times execution takes place can be 2 or more.

Also, the modulation signal data includes the pulse period Tc and port polarity data while allowing PWM signal frequencies to be set for each phase and allowing the load (4, 8) controlled by the PWM signals to be switched. However, the only requirement for the modulation signal data is that it contains the selected initial duty cycle, the selected duty change rate, and the selected unit pulse signal count (selected unit count) read from the data table.

The present invention is suited for devices for generating pulse width modulation signals that output pulse width modulated signals with varied duty cycles to control the operations of a load.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. In a pulse width modulation signal generating device that generates a pulse width modulation signal formed continuously from a plurality of unit pulse signals while changing a duty cycle by a predetermined duty change rate, where a period of a unit pulse signal formed from a first level and a second level continuous with said first level is a fixed period Tc,
  a pulse width modulation signal generating device comprising:
  a data storage device that stores a plurality of sets of data of an initial duty cycle, a duty change rate, and a count of unit pulse signals forming a phase for defining individual phases of a pulse width modulation signal;
  a data reading device that, when generating said pulse width modulation signal, reads said plurality of sets of data stored in said storage device, a selected initial duty cycle, a selected duty change rate, and a selected unit pulse signal count for a phase to be generated;
  a period timer repeatedly measuring said fixed period Tc;
  an arithmetic processor thus performs calculations wherein, in a first unit pulse signal said selected initial duty cycle is multiplied with said fixed period Tc, and in a second and subsequent unit pulse signals, said selected duty change rate is added to or subtracted from a duty cycle of an immediately preceding unit pulse signal with a duty cycle obtained by said addition or subtraction being multiplied with said fixed period Tc, resulting in a first level generating interval T1 for each unit pulse signal;
  a PWM timer initiating a time measurement of said first level generating interval T1 each time said period timer initiates a time measurement for said fixed period Tc; and
  a signal generating device wherein, when said period timer initiates a time measurement of said fixed period Tc, a signal level of said pulse width modulation signal is set to a first level and when said PWM timer measures said first level generating interval T1, said first level is changed to said second level, and said second level is maintained until said period timer measures said fixed period Tc;
  wherein said signal generating device continuously generates a number of unit pulse signals determined by said selected unit pulse signal count and generates a pulse width modulation signal for 1 phase.

2. The pulse width modulation signal generating device of claim 1, wherein said data reading device, for each of said plurality of phases, reads a selected initial duty cycle, a selected duty change rate, and a selected unit pulse signal count selected for each phase; and
  said signal generating device continuously generates pulse width modulation signals for each phase.

3. A pulse width modulation signal generating device as described in claim 1 wherein:
  N types of data (where N is a positive integer of at least 2) can be stored in said storage means for said unit pulse signal count of a phase, said data being positive integers approximating an exponential function F(x)

$$F(x)=a^x$$

where x is a positive integer and a is a positive number of at least 1, so that when said N types of data are rearranged from a minimum value K(1) to a maximum value K(n), an n-th data K(n) (where n is a positive integer of at least 2) and an (n−1)-th data K(n−1) have a difference d(n) that is represented in one of said data at an (n−1)-th position or below.

4. A pulse width modulation signal generating device as described in claim 3 wherein a is 1.321279.

5. A pulse width modulation signal generating device as described in claim 2 wherein:
  N types of data (where N is a positive integer of at least 2) can be stored in said storage means for said unit pulse signal count of a phase, said data being positive integers approximating an exponential function F(x)

$$F(x)=a^x$$

where x is a positive integer and a is a positive number of at least 1, so that when said N types of data are rearranged from a minimum value K(1) to a maximum value K(n), an n-th data K(n) (where n is a positive integer of at least 2) and an (n−1)-th data K(n−1) have a difference d(n) that is represented in one of said data at an (n−1)-th position or below.

6. A pulse width modulation signal generating device as described in claim 5 wherein a is 1.321279.

7. In a pulse width modulation signal generating method that generates a pulse width modulation signal formed continuously from a plurality of unit pulse signals while changing a duty cycle by a predetermined duty change rate, where a period of a unit pulse signal formed from a first level and a second level continuous with said first level is a fixed period Tc,
  a pulse width modulation signal generating method comprising the steps of:
  reading, for a phase to be generated, an initial duty cycle, a duty change rate, and a count of unit pulse signals forming said phase from a data storage device that stores a plurality of sets of data of an initial duty cycle, a duty change rate, and a count of unit pulse signals forming a phase for defining individual phases of a pulse width modulation signal;
  multiplying said selected initial duty cycle by said fixed period Tc to calculate a first level generating interval T1 of a first unit pulse signal;
  generating a unit pulse signal, wherein said first level generating interval T1 after said fixed period Tc begins is set to a first level, and a remaining interval in said fixed period Tc is set to a second level; and
  calculating first level generating intervals Ta for second and subsequent unit pulse signals by adding or subtracting said selected duty change rate to a duty cycle of an immediately preceding unit pulse and multiplying said duty cycle obtained by adding or subtracting to said fixed period Tc;
  wherein a pulse width modulation signal for one phase is generated by repeatedly executing, by a number corresponding to said selected unit pulse signal count, a step for generating signals that, after executing said reading step and said multiplying step, executes said generating step and then said calculations step.

8. A pulse width modulation signal generating method as described in claim 7 wherein N types of data (where N is a positive integer of at least 2) can be stored in said data storage device for said unit pulse signal count of a phase, said data being positive integers approximating an exponential function F(x)

$$F(x)=a^x$$

where x is a positive integer and a is a positive number of at least 1, so that when said N types of data are rearranged from a minimum value K(1) to a maximum value K(n), an n-th data K(n) (where n is a positive integer of at least 2) and an (n−1)-th data K(n−1) have a difference d(n) that is represented in one of said data at an (n−1)-th position or below.

9. A pulse width modulation signal generating method as described in claim 8 wherein, in an operation for repeatedly and continuously executing said signal generating step by a number corresponding to said selected unit pulse signal count:

- K(n) subroutines, where n is from 2 to N, are arranged in order upstream in execution flow from a K(1) subroutine, where said K(1) subroutine executes said signal generating step K(1) times, and said K(n) subroutines are jump points for when said selected unit pulse signal count is K(n);
- if d(n) is K(1), the jump point for said K(n) subroutine is said K(1) subroutine;
- if d(n) is an integer other than said K(1), then for an n' where d(n) is K(n'), a K(n') subroutine, which serves as a jump point for when said selected unit pulse signal count is d(n), is used as a jump point for said K(n) subroutine; and
- at said K(n') subroutine jump point, a jump point subroutine is similarly determined where n' is n, and said operation is repeated until d(n) is K(1) and said K(1) subroutine is a jump point.

10. In a pulse width modulation signal generating method that generates a pulse width modulation signal formed continuously from a plurality of unit pulse signals while changing a duty cycle by a predetermined duty change rate, where a period of a unit signal formed from a first level and a second level continuous with said first level is a fixed period Tc, a pulse width modulation signal generating method comprising the steps of:

reading, for a phase to be generated, an initial duty cycle, a duty change rate, and a count of unit pulse signals forming said phase from a data storage device that stores a plurality of sets of data of an initial duty cycle, a duty change rate, and a count of unit pulse signals forming a phase for defining individual phases of a pulse width modulation signal;

multiplying said selected initial duty cycle by said fixed period Tc to calculate a first level generating interval T1 of a first unit pulse signal;

generating a unit pulse signal, wherein said first level generating interval T1 after said fixed period Tc begins is set to a first level and a remaining interval in said fixed period Tc is set to a second level; and calculating first level generating intervals Ta for second and subsequent unit pulse signals by adding or subtracting said selected duty change rate to a duty cycle of an immediately preceding unit pulse and multiplying said duty cycle obtained by adding or subtracting to said fixed period Tc;

wherein a pulse width modulation signal for one phase is generating by repeatedly executing, by a number corresponding to said selected unit pulse signal count, a step for generating a unit signal that, after executing said reading step and said multiplying step, repeats twice an execution of said generating step and then said calculating step.

11. A pulse width modulation signal generating method as described in claim 10 wherein N types of data (where N is a positive integer of at least 2) can be stored in said data storage device for said unit count of a phase, said data being positive integers approximating an exponential function F(x)

$$F(x)=a_x$$

where x is a positive integer and a is a positive number of at least 1, so that when said N types of data are rearranged from a minimum value K(1) to a maximum value K(n), an n-th data K(n) (where n is a positive integer of at least 2) and an (n−1)-th data K(n−1) have a difference d(n) that is represented in one of said data at an (n−1)-th position or below.

12. A pulse width modulation signal generating method as described in claim 11 wherein, in an operation for repeatedly and continuously executing said signal generating step by a number corresponding to said selected unit count:

- K(n) subroutines, where n is from 2 to N, are arranged in order upstream in execution flow from a K(1) subroutine, where said K(1) subroutine executes said signal generating step K(1) times, and said K(n) subroutines are jump points for when said selected unit pulse signal count is K(n);
- if d(n) is K(1), the jump point for said K(n) subroutine is said K(1) subroutine;
- if d(n) is an integer other than said K(1), then for an n' where d(n) is K(n'), a K(n') subroutine, which serves as a jump point for when said selected unit pulse signal count is d(n), is used as a jump point for said K(n) subroutine; and
- at said K(n') subroutine jump point, a jump point subroutine is similarly determined where n' is n, and said operation is repeated until d(n) is K(1) and said K(1) subroutine is a jump point.

* * * * *